United States Patent [19]

Niimi et al.

[11] Patent Number: 4,587,620

[45] Date of Patent: May 6, 1986

[54] NOISE ELIMINATION DEVICE

[75] Inventors: Koji Niimi; Takayasu Kondo, both of Hamamatsu, Japan

[73] Assignee: Nippon Gakki Seizo Kabushiki Kaisha, Hamamatsu, Japan

[21] Appl. No.: 373,437

[22] Filed: Apr. 30, 1982

[30] Foreign Application Priority Data

| May 9, 1981 | [JP] | Japan | 56-69814 |
| May 9, 1981 | [JP] | Japan | 56-69815 |
| May 9, 1981 | [JP] | Japan | 56-69816 |
| May 9, 1981 | [JP] | Japan | 56-69817 |
| May 9, 1981 | [JP] | Japan | 56-69818 |
| May 9, 1981 | [JP] | Japan | 56-69819 |

[51] Int. Cl.$^4$ .......................... H04B 15/00; H04B 1/34
[52] U.S. Cl. ........................ 364/574; 328/163; 328/167; 364/728; 375/99; 455/296
[58] Field of Search ............... 364/574, 728, 819, 829, 364/572, 724, 825; 375/11, 12, 14, 99, 103; 455/296, 308; 328/162, 165, 163, 167

[56] References Cited

U.S. PATENT DOCUMENTS

| 3,947,636 | 3/1976 | Edgar | 328/163 X |
| 3,982,114 | 9/1976 | Hook | 364/819 |
| 4,066,878 | 1/1978 | Miller et al. | 364/724 |
| 4,177,430 | 12/1979 | Paul | 328/163 X |
| 4,211,897 | 7/1980 | Ichikawa et al. | 364/728 X |
| 4,224,679 | 9/1980 | Nossen et al. | 364/819 X |
| 4,228,545 | 10/1980 | Murakami | 455/296 |
| 4,280,218 | 7/1981 | Gordy et al. | 455/296 X |
| 4,281,411 | 7/1981 | Bonn et al. | 375/14 |
| 4,355,367 | 10/1982 | Masuzawa et al. | 328/167 X |
| 4,355,368 | 10/1982 | Zeidler et al. | 364/724 X |
| 4,388,724 | 6/1983 | Göckler | 328/162 X |
| 4,404,645 | 9/1983 | Elings et al. | 364/728 |
| 4,408,332 | 10/1983 | Sari | 375/14 |

Primary Examiner—Errol A. Krass
Assistant Examiner—Kevin J. Teska
Attorney, Agent, or Firm—Spensley Horn Jubas & Lubitz

[57] ABSTRACT

A noise elimination device employs a concept of the linear prediction method. According to the invention, a linear prediction coefficient of a digitized, continuous input signal (an original signal) is calculated, a linear predicted value is computed from this linear prediction coefficient, difference (a prediction error) between the linear predicted value and the input signal is computed whereas a threshold value is set in accordance with the momentarily changing input signal, the judgement that a noise has occurred is made when the predicted value has exceeded the threshold value and thereupon a substitution signal is produced on the basis of an input signal existing in the vicinity of the time point at which the noise has occurred, and the section in which the noise has occurred is substituted by this substitution signal thereby to eliminate the noise. By virtue of employing the linear prediction method, the necessity for including an error detection code as a part of data has been obviated, the device is made applicable to elimination of a noise contained in an original signal, possibility of making an erroneous judgement has been reduced even with respect to signals having little correlation between themselves by varying the threshold value in accordance with the input signal, and a sufficient noise suppression effect is expected against a burst error or a relatively long noise by producing a substitution signal resembling an input signal on the basis of the input signal containing no noise in the vicinity of the noise section.

13 Claims, 67 Drawing Figures

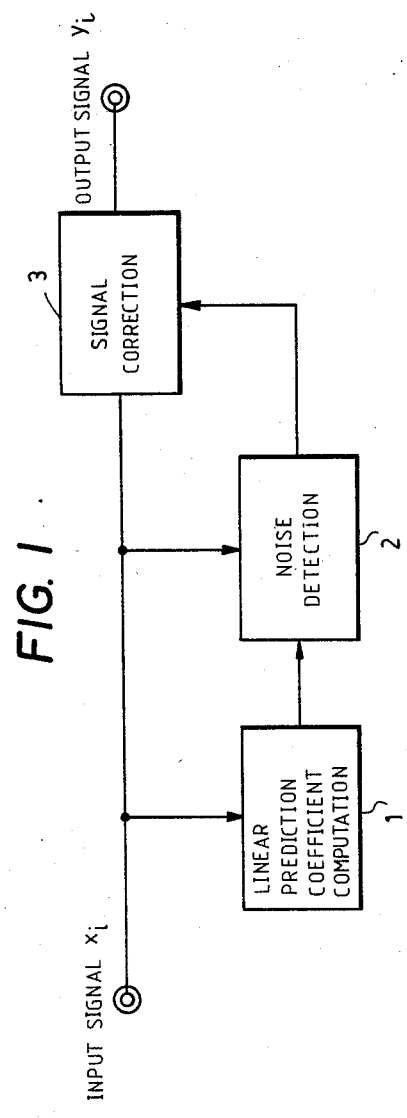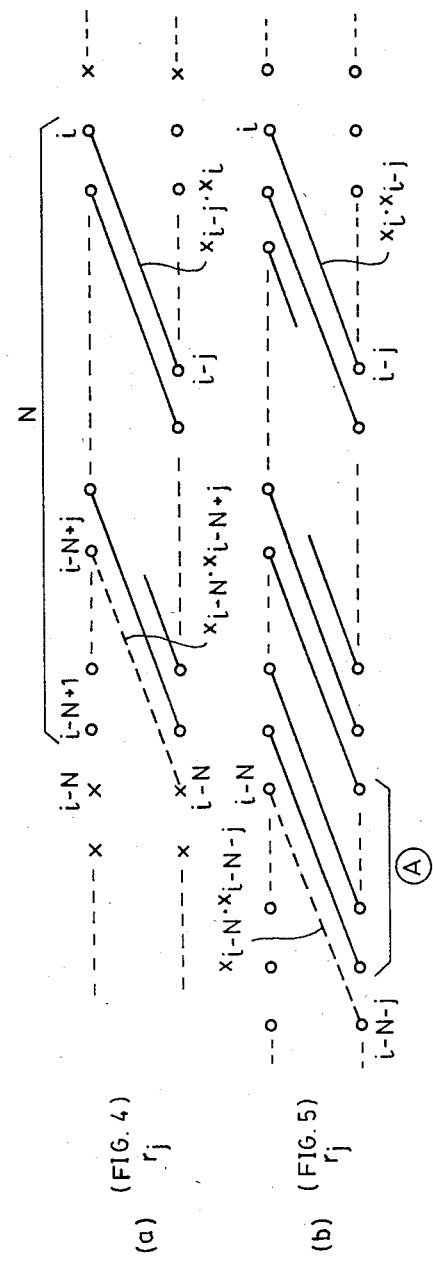

| FIG. 2A | FIG. 2B |

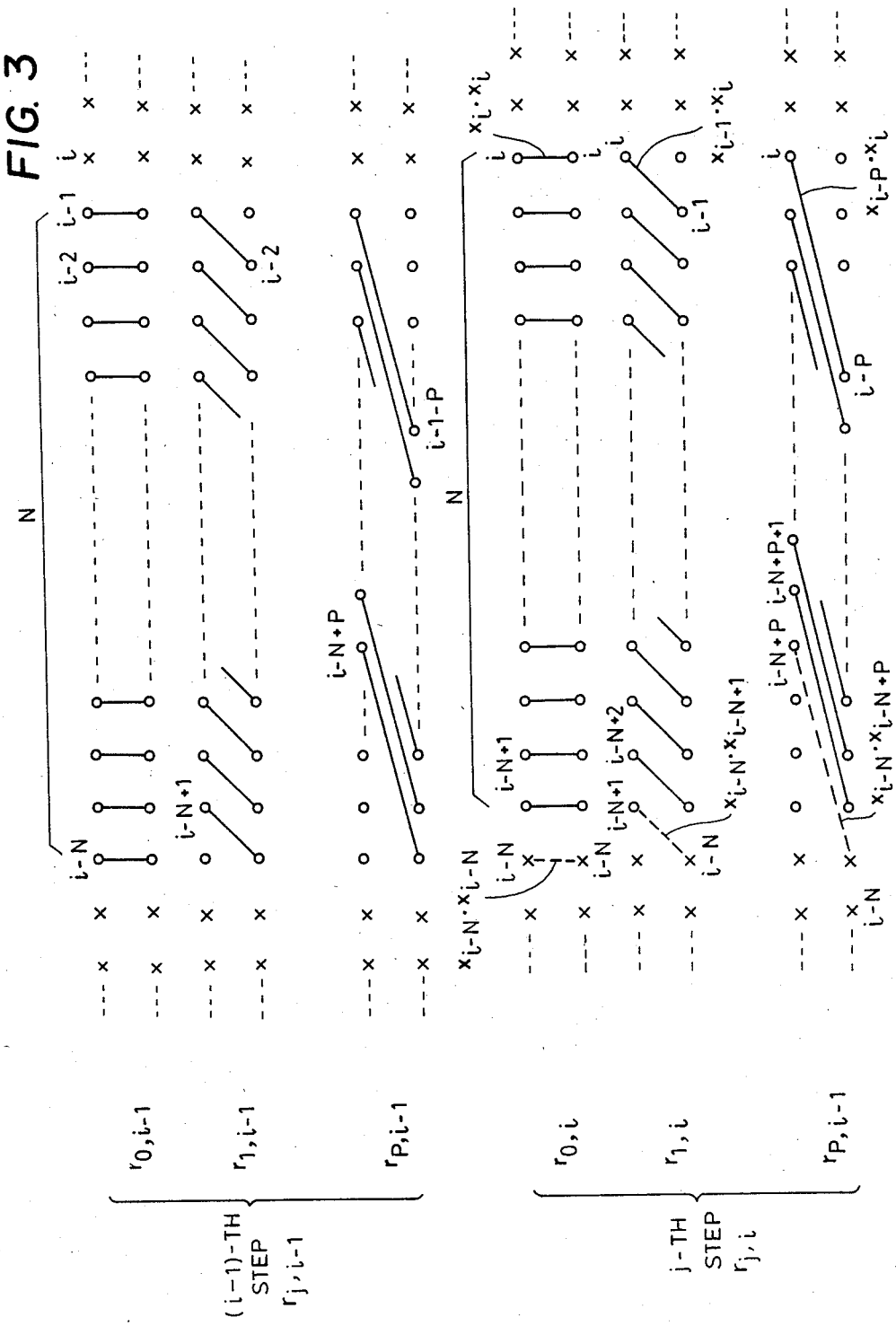

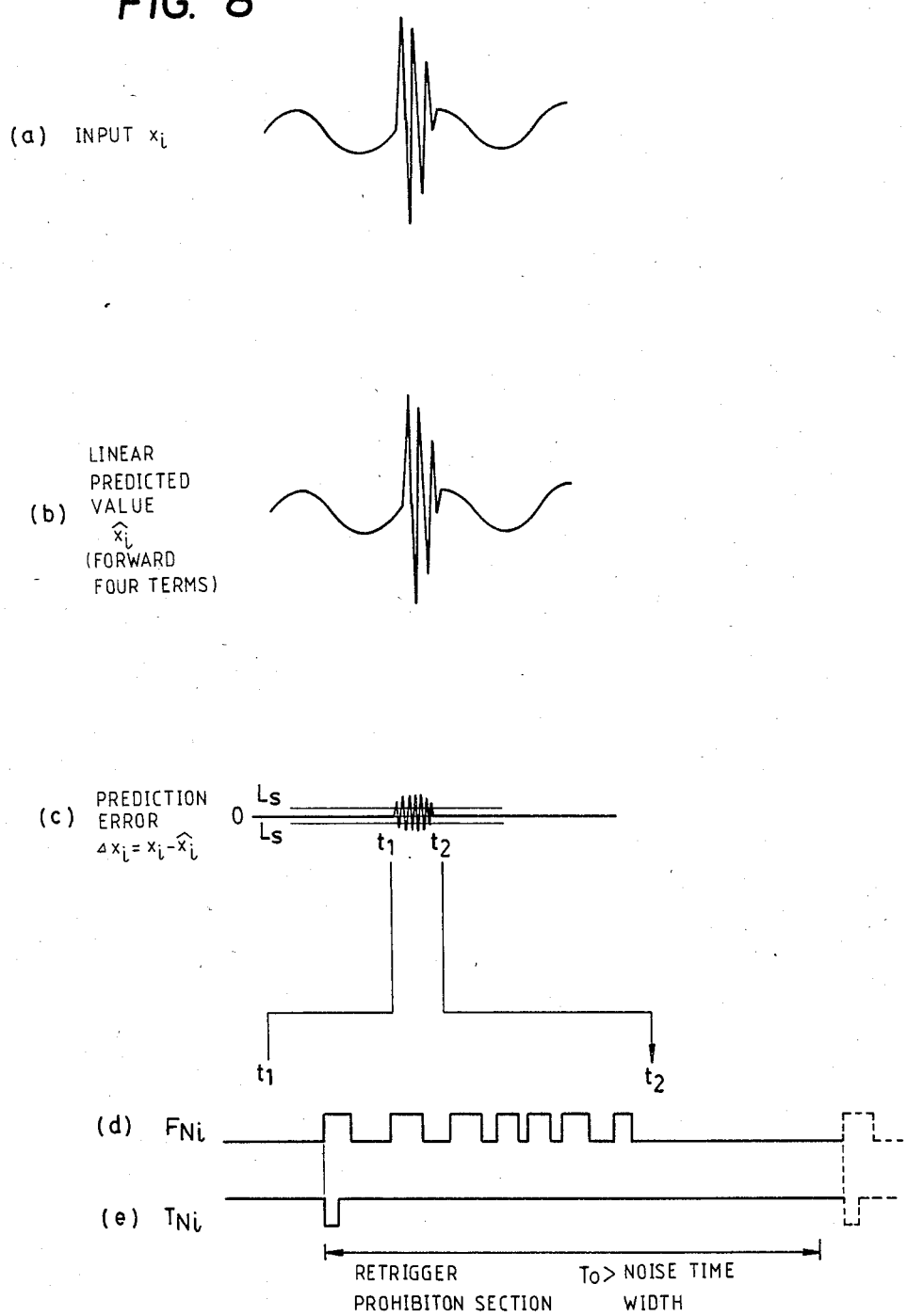

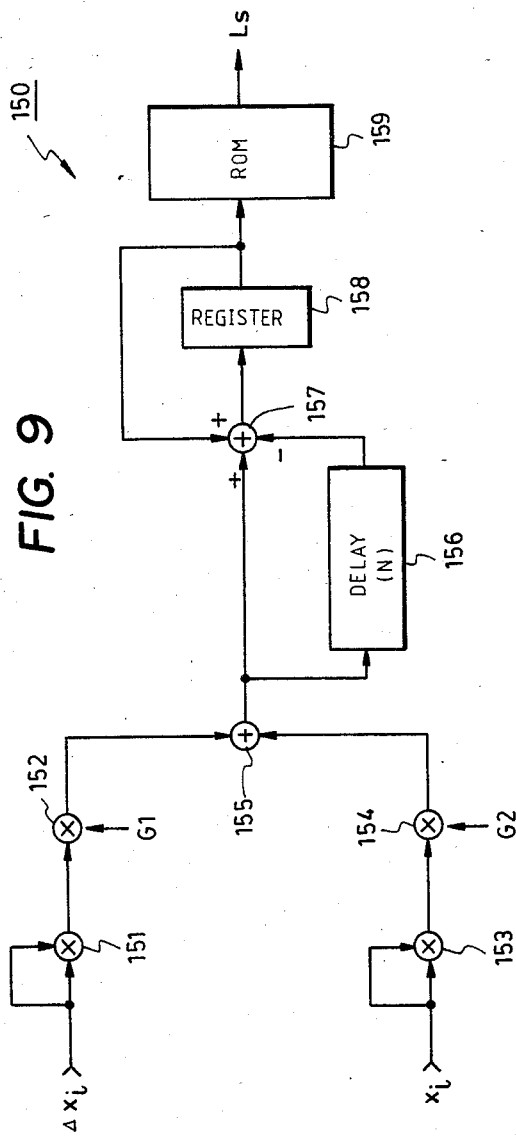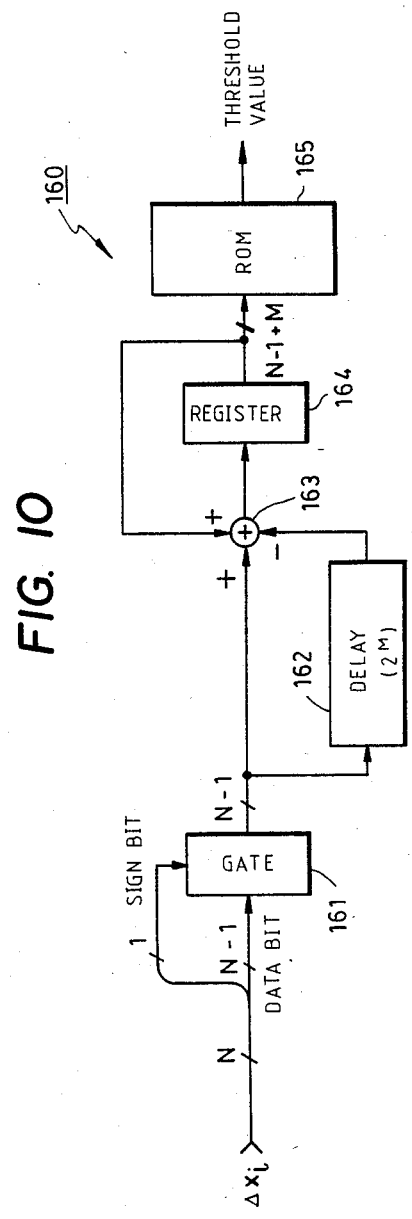

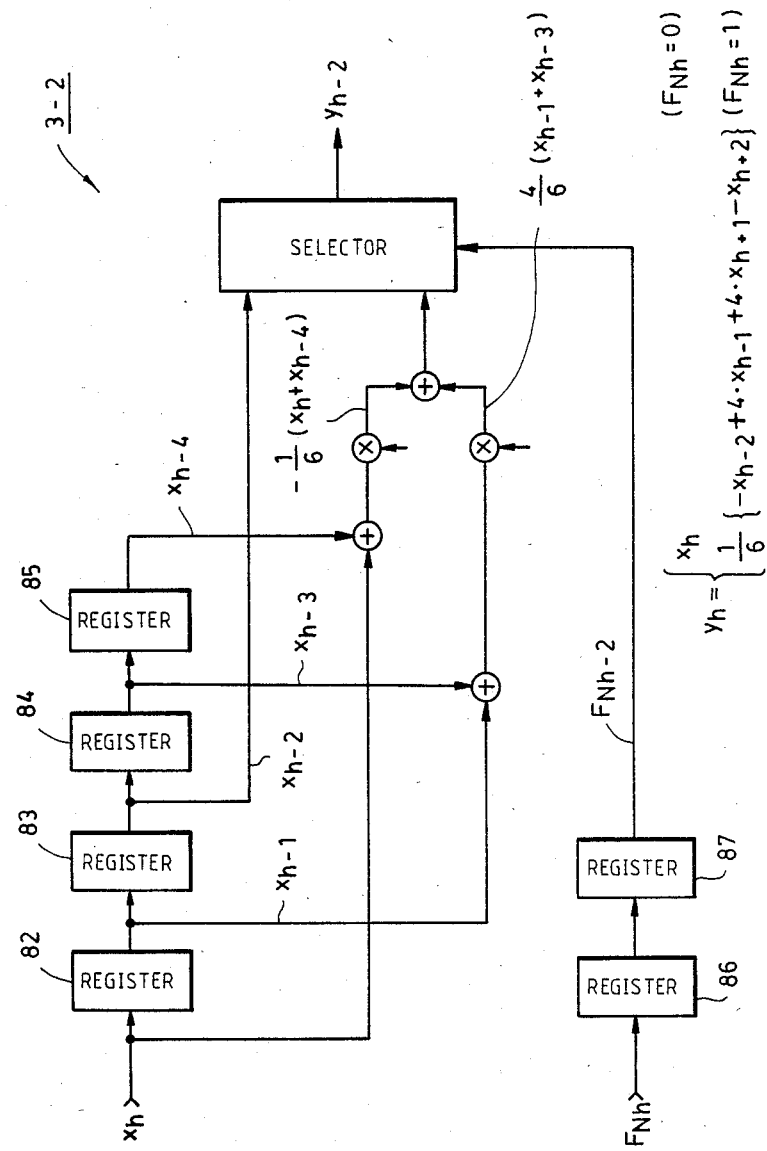

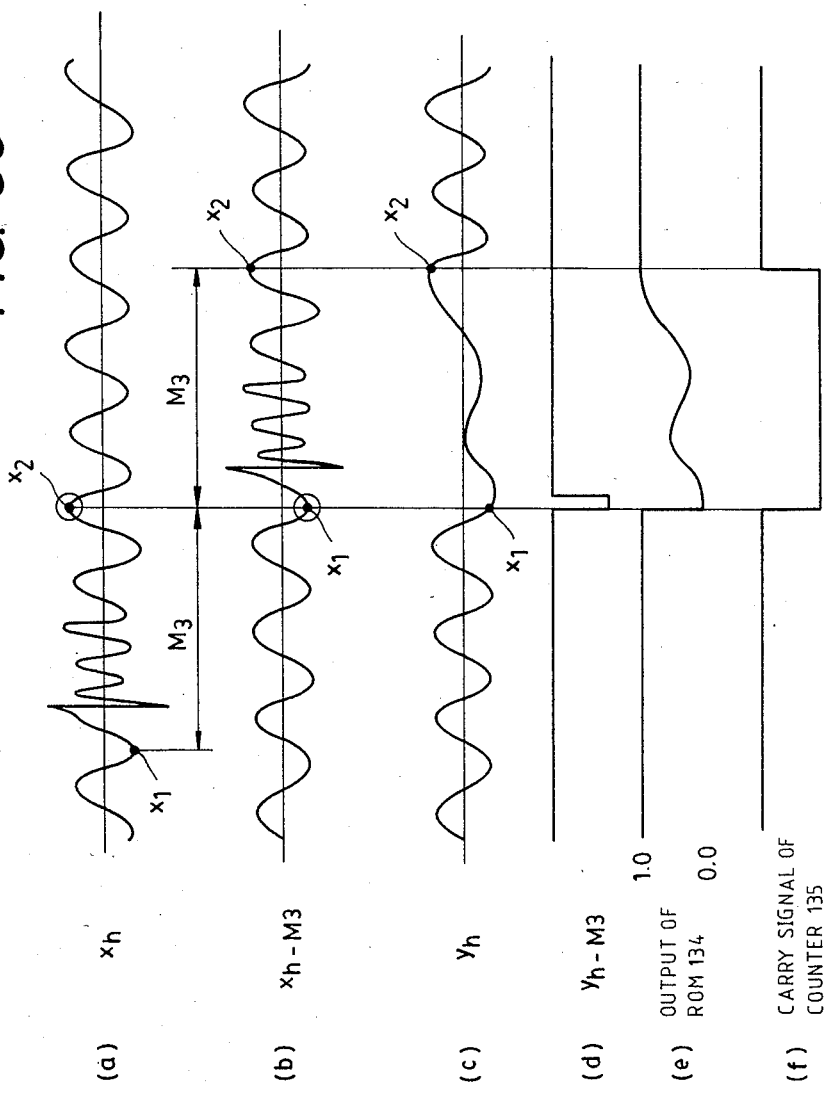

NOISE ELIMINATION DEVICE

BACKGROUND OF THE INVENTION

This invention relates to a noise elimination device capable of eliminating noise by detecting a pulse-like noise mixed in an audio signal by detecting an abnormal change in an original signal on the basis of a linear prediction method and substituting the time portion including the noise by a substituting signal.

There are various noises mixed into an audio signal such, for example, as a noise caused by a code error in a digital signal transmission system, e.g., PCM (pulse code modulation) transmission system and, in an analog transmission system, a clicking noise occurring in playing of a record due to scratches and dirts on the record and an ignition noise occurring in an automobile radio tuner.

Proposals have heretofore been made to eliminate such noise mixed in an audio signal. The process of the noise elimination generally consists of a noise detection process for judging whether an input signal is a normal signal or noise and a signal correction process for restoring an original signal in a case where noise has occurred. For achieving a proper noise elimination, both the noise detection process and the signal correction process must be accurately effected. In the prior art devices, a parity check method utilizing an error detection code as a part of data and a CRC (cyclic redundancy check) code method are generally employed as the noise detection process as is well known in PCM systems. These methods, however, are disadvantageous in that there is limitation in a code format and that they are theoretically not applicable to a noise occurring in an analog signal, i.e., they are applicable only to detection of a noise produced by a burst error or the like cause occurring in transmission of a digitized signal and incapable of detecting a noise contained in the original signal. For overcoming this difficulty, there have been proposed a method for detecting noise on the basis of a prediction error between a linear predicted value of an input signal obtained from successive input signals and an input signal (Sugahara, Ikeda, Yamazaki and Ito: Japan Acoustics Society Lectures and Theses 3-2-6, October 1979) and also a method for detecting noise by utilizing subtraction in the frequency spectrum region (Yoshitani: Electronic Communication Theses 1980/12 Vol. J63A No. 12). These methods, however, are incapable of properly dealing with a uniform change in the noise signal level or tone signals which have little correlation between themselves (e.g. so-called "pink noise" used in a music synthesizer and rising portions of string instrument tones) resulting in an erroneous detection, e.g. overlooking noise or misjudging a musical tone for noise.

As to the signal correction process, prior art methods which have heretofore been generally practiced include a previous data hold method according to which a correct value immediately preceding occurrence of a noise is maintained over a section in which such noise takes places, a linear interpolation method according to which a mean value of a correct value immediately before occurrence of a noise and a correct value immediately after passing of the noise is maintained over a section in which the noise takes place and a method disclosed in the specification of Japanese laid-open patent application No. 55-84010. These methods are found to be effective against a single data error but have no noise suppression effect against a noise occurring over a relatively long period of time of 30 samples to 50 samples (i.e., about one (1) msec at a sampling frequency of 50 kHz) or rather have an adverse effect in that difference in level is produced at a joint between an interpolating signal and an original signal.

SUMMARY OF THE INVENTION

It is an object of the present invention to provide a noise elimination device capable of accurately discriminating a noise from a correct signal even with respect to audio signals which have little correlation between themselves without including an error detection code as a part of data and suppressing a burst error (an error occurring over a long period of time) or a relatively long noise lasting about one (1) msec, and being applicable to a noise contained in an original signal.

According to the invention, a linear prediction coefficient of a digitized, continuous input signal (an original signal) is calculated, a linear predicted value is computed from this linear prediction coefficient, difference (a prediction error) between the linear predicted value and the input signal is computed whereas a threshold value is set in accordance with the momentarily changing input signal, the judgement that a noise has occurred is made when the predicted value has exceeded the threshold value and thereupon a substitution signal is produced on the basis of an input signal existing in the vicinity of the time point at which the noise has occurred, and the section in which the noise has occurred is substituted by this substitution signal thereby to eliminate the noise. Alternatively stated, the present invention has employed a concept of the linear prediction method taking into account a general theory that waveforms of tone and voice signals are generally considered to follow Markov process (i.e., probability process within which a signal at a certain time point is subject to influence of a past signal). By employing the linear prediction method, the necessity for containing the error detection code as a part of data has been obviated, the device is applicable to elimination of a noise contained in an original signal, possibility of making an erroneous judgement has been reduced even with respect to signals having little correlation between themselves by varying the threshold value in accordance with the input signal, and a sufficient noise suppression effect is expected against a burst error or a relatively long noise lasting about one (1) msec by producing a substitution signal resembling an input signal on the basis of the input signal containing no noise in the vicinity of the noise section.

BRIEF DESCRIPTION OF THE DRAWINGS

In the accompanying drawings:

FIG. 1 is a block diagram schematically showing an embodiment of the invention illustrated in FIG. 2 and the following figures.

FIG. 3 is a view illustrating a method of obtaining the autocorrelation function by successive operations;

FIG. 6 is a view illustrating a method of obtaining the autocorrelation function by the circuit shown in FIG. 5;

FIG. 8 comprising FIGS. 8(a)-8(e) shows waveforms for explaining noise detection based on difference $\Delta x_i$ between input $x_i$ and its linear prediction value $\hat{x}_i$;

FIGS. 9, 10, 11 and 12 are circuit diagrams each showing other examples of a threshold value setting circuit;

FIG. 15 (b) is a block diagram showing an example of signal correction circuit which uses for a substitution signal the signal from which noise has been eliminated;

FIGS. 18(a)-18(f) illustrates waveforms given in the circuit shown in FIG. 15 (a);

FIGS. 19(a)-19(h) illustrates waveforms given in the circuit shown in FIG. 15 (b);

FIGS. 23(a)-23(g) shows waveforms given in the circuit shown in FIG. 22;

FIG. 25 (b) is a block diagram showing a circuit which has a cross fader combined to the circuit illustrated in FIG. 25 (a);

FIGS. 27(a)-27(f) illustrates waveforms given in the circuits shown in FIG. 26;

FIG. 30 comprising FIGS. 30(a)-30(f) illustrates waveforms given in the circuit shown in FIG. 29.

DESCRIPTION OF PREFERRED EMBODIMENTS

Referring to FIG. 1 which schematically shows an embodiment of the invention to be described in detail later, the original signal is sampled at a suitable period and digitized to become input signal $x_i$. Linear prediction coefficient computation circuit 1 calculates an optimum prediction coefficient of input signal $x_i$ in a short interval and sends it to noise detection circuit 2 which calculates predicted value $\hat{x}_i$ on the basis of the given prediction coefficient and calculates difference $\Delta x_i$ (prediction error) between input signal $x_i$ and predicted value $\hat{x}_i$, namely $\Delta x_i = x_i - \hat{x}_i$. When the absolute value $|\Delta x_i|$ of the prediction error is greater than threshold value $L_s$, noise detection circuit 2 judges that there exists noise and sends a noise detection signal to signal correction circuit 3 which generates a suitable substitution signal for input signal $x_i$ as output signal $y_i$. When noise is not detected, output signal $y_i$ is identical to input signal $x_i$.

Figures 2, 2A:
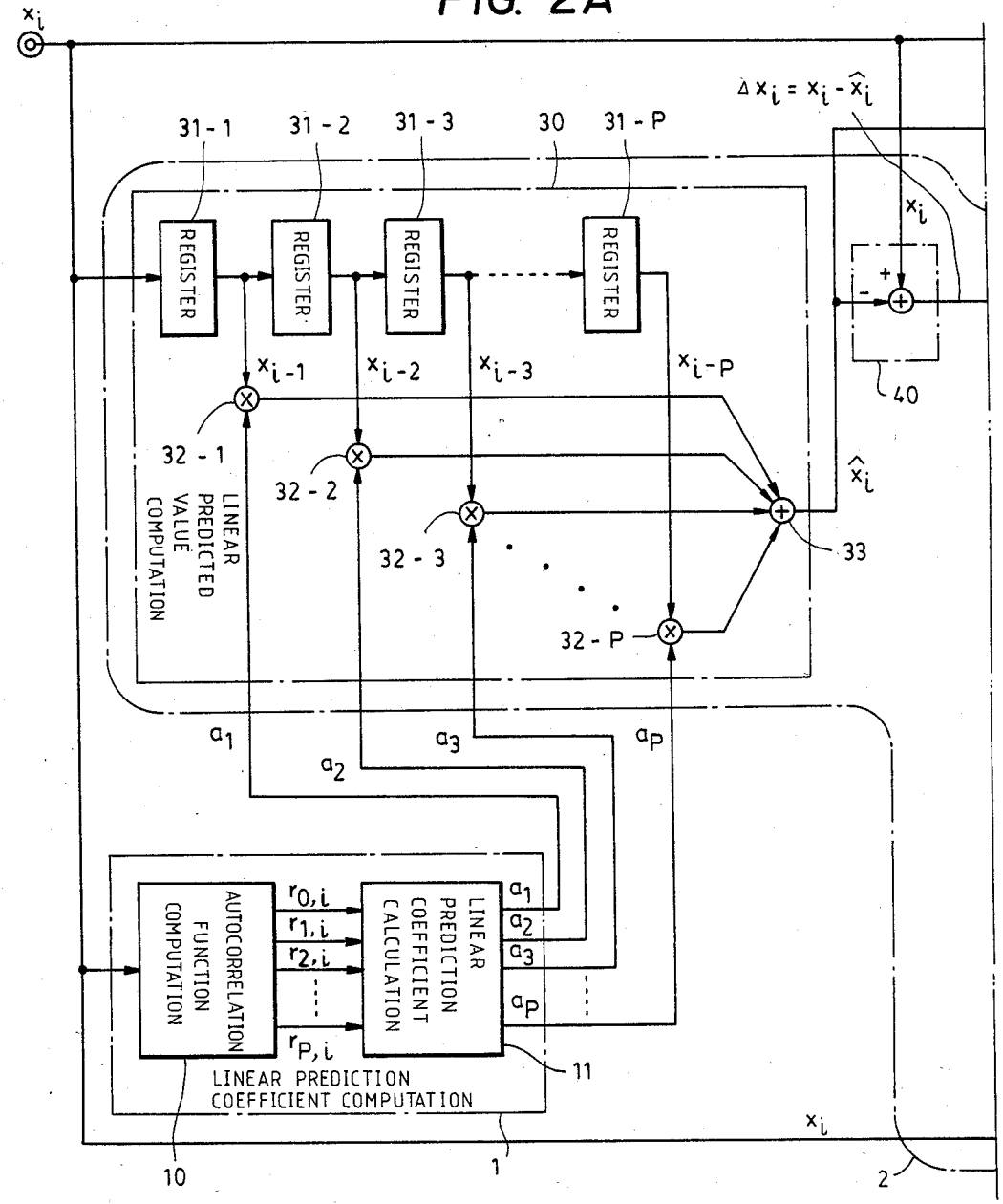
FIG. 2 is a block diagram of the embodiment of the invention.

FIG. 2 illustrates the embodiment shown in FIG. 1 in detail. Description will now be given of each part of the circuit shown in FIG. 2. It is noted that the delay circuit used in the embodiment of the invention may be a bucket brigade device for an analog signal or a shift register for a digital signal.

(1) LINEAR PREDICTION COEFFICIENT COMPUTATION CIRCUIT 1

Linear prediction coefficient computation circuit 1 shown in FIG. 2 first calculates autocorrelation functions $r_0, r_1, \ldots, r_p$ by autocorrelation function computation circuit 10 and solves simultaneous equations with coefficients $r_0, r_1, \ldots, r_p$ by linear prediction coefficient calculation circuit 11, thereby obtaining linear prediction coefficients $a_1, a_2, \ldots, a_p$.

Autocorrelation functions and linear prediction coefficients are calculated as specifically described below.

(A) COMPUTATION OF AUTOCORRELATION FUNCTIONS

Autocorrelation function $r_j$ ($j=0, 1, 2, \ldots$) of a sample train $x_i$ ($i=\ldots, -2, -1, 0, 1, 2, \ldots$) of a sampled and digitized signal is defined in general as an expected value of product of values at two samples which are j-th samples from each other and is expressed by the following equation (sampling is made with a sampling frequency about 50 kHz in this embodiment so as to apply to the audio signal):

$$r_j = \lim_{N \to \infty} \frac{1}{2N+1} \sum_{k=-N}^{N} x_k \cdot x_{k+j} (j = 0, 1, 2, \ldots) \quad (1)$$

Equation (1) gives a correlation function of the entire signal, irrespective of time.

When a correlation function of the ever-changing signal is to be considered in respect of a short interval, a shortinterval autocorrelation function which depends on time i is used as an approximate value for the correlation function shown by Equation (1). Short-interval autocorrelation function $r_{j,i}$ for the interval comprising a sample at time i and (N−1) samples immediately preceding it (the total number of the samples here, therefore, is N) is expressed as:

$$r_{j,i} = \frac{1}{N} \sum_{k=i-N+1}^{i} x_k \cdot x_{k+j} (j = 0, 1, 2, \ldots, N-1) \quad (2)$$

wherein a sample $x_{k+j}$ is assumed to be 0 when it is out of the subject interval (i.e., from i−N+1 to i). Therefore, autocorrelation function $r_j$ is 0 when j>N, that is, when two samples are separated from each other by N or more samples. According to the experiments conducted by the inventors, all of the N correlation functions need not be known but knowledge of correlation functions of only five or six terms of lower orders (i.e., j is from 0 to 5 or 6) is sufficient to carry out the noise detection. Constant coefficient 1/N in Equation (2) does not substantially affect the calculation of the prediction coefficients so that it may be neglected.

Accordingly, short-interval autocorrelation function $r_{i,j}$ is shown as:

$$r_{j,i} = \sum_{k=i-N+1}^{i-j} x_k \cdot x_{k+j} \, (j = 0, 1, 2, \ldots, p) \quad (3)$$

which is expanded as $$\left. \begin{aligned} r_{0,i} &= x_{i-N+1}^2 + x_{i-N+2}^2 + \cdots + x_i^2 \\ r_{1,i} &= x_{i-N+1} \cdot x_{i-N+2} + x_{i-N+2} \cdot x_{i-N+3} + \cdots + \\ & \quad x_{i-1} \cdot x_i \\ & \quad \vdots \\ r_{p,i} &= x_{i-N+1} \cdot x_{i-N+1+p} + \\ & \quad x_{i-N+2} \cdot x_{i-N+2+p} + \cdots + x_{i-p} \cdot x_i \end{aligned} \right\} \quad (4)$$

Equation (4) is rewritten in the form of successive operations so as to be performed by a computer. This is explained by FIG. 3 wherein data at respective time points are shown by a circle in the upper and lower lines (data out of the subject interval all have a value 0 and are shown by the mark X) and two data correlated with each other are connected by a line. If autocorrelation function $r_{j,i-1}$ is known in step (i−1), autocorrelation function $r_{j,i}$ is obtained in step i by adding $x_{i-j} \cdot x_i$, i.e., product of the couple of data that have newly entered the interval, to $r_{j,i-1}$ (such data are connected by a bold solid line in FIG. 3) and subtracting therefrom $x_{i-N} \cdot x_{i-N+j}$, i.e., product of the couple of data that have left the interval (such data are connected by a bold dotted line), as expressed in the following equation.

$$r_{j,i} = r_{j,i-1} + x_{i-j} x_i - x_{i-N} x_{1-N+j} \quad (5)$$

Figure 4:
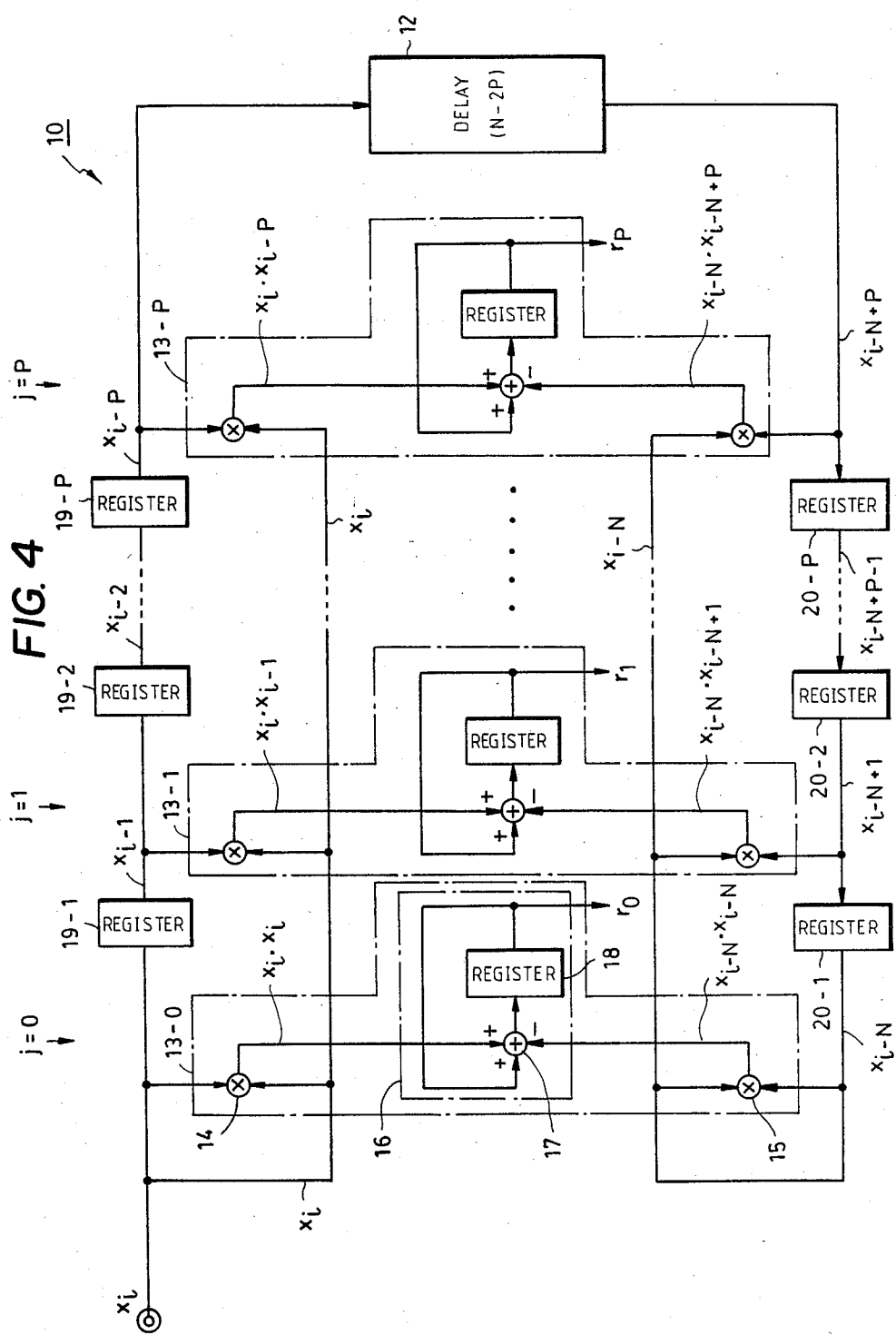
FIG. 4 is a block diagram showing an example of a circuit to execute the method shown in FIG. 3.

FIG. 4 illustrates an example of autocorrelation function computation circuit 10 to perform the calculation of Equation (5). Input signal $x_i$ is shifted through p registers 19-1, 19-2, ..., 19-p successively, each of these registers giving signals $x_{i-1}, x_{i-2}, \ldots, x_{i-p}$, respectively. Signal $x_{i-p}$ is delayed through delay circuit 12 by (N−2P) stages and outputted therefrom as $x_{i-N+P}$ which is further shifted through p registers 20-p, ..., 20-2, 20-1, successively, each of these registers giving signals $x_{i-N+P-1}, \ldots, x_{i-N+1}, x_{i-N}$, respectively. The last output signal $x_{i-N}$ corresponds to N stages delayed signal $x_i$.

Circuits 13-0, 13-1, ..., 13-p shown in FIG. 4 are provided to obtain autocorrelation functions $r_0, r_1, \ldots, r_p$ for $j=0, 1, \ldots p$, respectively. In circuit 13-0 for obtaining autocorrelation function $r_0$ for $j=0$, for example, multiplier 14 calculates $x_i \cdot x_i$ or product of the couple of data that have newly entered the subject interval while multiplier 15 calculates $x_{i-N} \cdot x_{i-N}$ or product of the couple of data that have left the interval. Accumulator 16, comprising adder 17 and register 18, cumulatively adds the output of multiplier 14 and subtracts the output of multiplier 15 in every sampling period. Register 18 calculates autocorrelation function $r_{0,i}$ for time i in step i. Function $r_{0,i+1}$ is then obtained in the next step (i+1) by adding $x_{i+1} \cdot x_{i+1}$ or product of the couple of data that have newly entered the interval to autocorrelation function $r_{0,i}$ and subtracting therefrom $x_{i-N+1} \cdot x_{i-N+1}$ or product of the couple of data that have left the interval. Autocorrelation functions $r_1, r_2, \ldots, r_p$ for $j=1, 2, \ldots, p$ are likewise obtained step by step in other circuits 13-1, 13-2, ..., 13-p. Each register and the delay circuit shown in FIG. 4 are all cleared at the initial stage.

Figure 5:
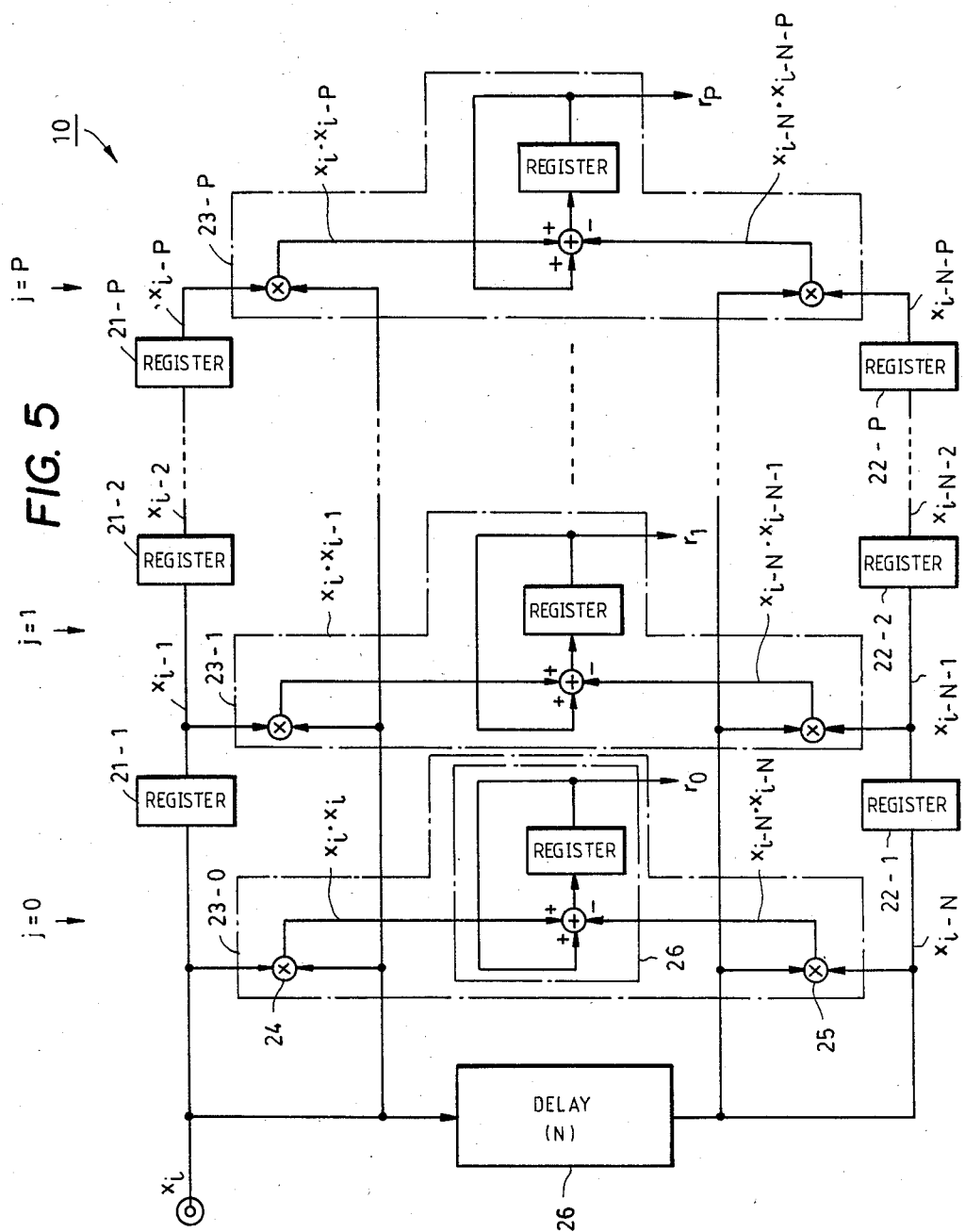
FIG. 5 is a block diagram showing another example of the autocorrelation function computation circuit.

FIG. 5 illustrates another example of autocorrelation function computation circuit 10 wherein the delaying by the registers and delay circuit is limited to one direction (without returning as in the circuit shown in FIG. 4). In the example shown in FIG. 4, the data out of the subject interval which comprises N samples, as shown in FIG. 6 (a), are all rated 0 and autocorrelation function $r_{j,i}$ is obtained in step i by adding $x_{i-j} \cdot x_i$ or product of the couple of data that have newly entered the interval to autocorrelation function $r_{j,i-1}$ and subtracting therefrom $x_{i-N} \cdot x_{i-N+j}$ or product of the couple of data that have left the interval (see Equation (5)) whereas in the example shown in FIG. 5, the data out of the interval are not rated 0, as shown in FIG. 6 (b), but used as they are for obtaining autocorrelation function. According to this method, autocorrelation function $r_{j,i}$ is expressed as $$r_{j,i} = \sum_{k=i-N+1}^{i} x_k \cdot x_{k-j} \, (j = 0, 1, 2, \ldots, p) \quad (6)$$

By successive operations $r_{j,i}$ may be obtained, as shown in FIG. 6 (b), by adding $x_i \cdot x_{i-j}$ or product of the couple of data that have newly entered the interval to autocorrelation function $r_{j,i-1}$ obtained in step (i−1) and subtracting therefrom $x_{i-N} x_{i-N-j}$ or product of the couple of data that have left the interval as expressed in the following equation:

$$r_{=j,i} = r_{j,i-1} + x_i x_{i-j} - x_{i-N} x_{i-N-j} \quad (7)$$

In the circuit shown in FIG. 5, input signal $x_i$ is shifted through p registers 21-1, 21-2, ..., 21-p in every sampling period, each register giving output signals $x_{i-1}, x_{i-2}, \ldots, x_{i-p}$, respectively. Delay circuit 26 delays input signal $x_i$ by N stages to output signal $x_{i-N}$ which is shifted through p registers 22-1, 22-2, ..., 22-p in every sampling period, each register giving signals $x_{i-N-1}, x_{i-N-2}, \ldots, x_{i-N-p}$. Circuits 23-0, 23-1, ..., 23-p are provided to obtain autocorrelation functions $r_0, r_1, \ldots, r_p$, respectively. In circuit 23-0, for example, multiplier 24 calculates $x_i \cdot x_i$ or product of the couple of data that newly enter the interval while multiplier 25 calculates $x_{i-N} \cdot x_{i-N}$ or product of the couple of data that leave the interval and then accumulator 26 adds the former value to, and subtracts the latter value from, the autocorrelation function calculated in the preceding step thereby to obtain autocorrelation function $r_0$ for $j=0$. Autocorrelation functions $r_1, \ldots, r_p$ are likewise obtained by circuits 23-1, ..., 23-p.

Although the circuit illustrated in FIG. 5 involves the surplus additions of the products of the coupled data indicated by the mark Ⓐ in FIG. 6 (b), no practical problem remains if the interval N is taken wide enough as compared with the number of prediction terms p (N>P), provided that p is not smaller than a certain number (3 to 5) so the error may be small. The condition N>P is, in fact, fully satisfied as N and P are set practically more or less at 2048 and 4, respectively. Further, according to the calculation method described above which is based on the successive operations, the number of computations involved may be small despite the relatively great N and, moreover, the number of prediction terms p may reasonably be small so that real time processing is facilitated and the circuit may be available in a simple arrangement.

Figure 7:
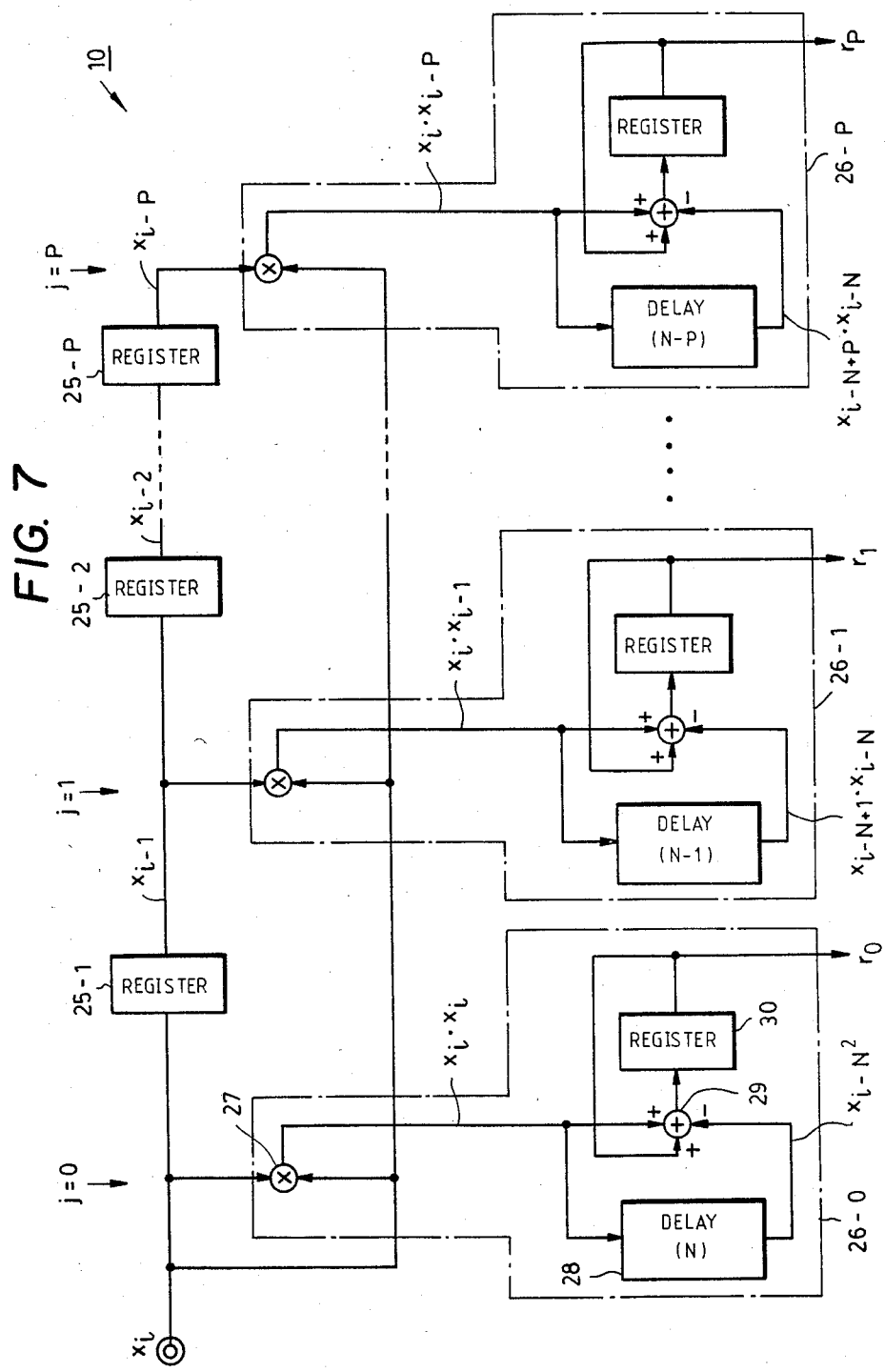
FIG. 7 is a block diagram of another example of the circuit to execute the method illustrated in FIG. 3.

FIG. 7 illustrates another example of autocorrelation function computation circuit 10 which treats the third term $x_{i-N} \cdot x_{i-N+j}$ (product of the couple of data that have left the interval) shown in Equation (5) as a delay of the second term $x_{i-j} \cdot x_i$ (product of the couple of data that have newly entered the interval), thereby halving the number of the multipliers used. Input signal $x_i$ is successively shifted through p registers 25-1, 25-2, ..., 25-p shown in FIG. 7 in every sampling period. In circuit 26-0, multiplier 27 calculates $x_i \cdot x_i$ whereas delay circuit 28 delays $x_i \cdot x_i$ by N stages to output signal $x_{i-N} \cdot x_{i-N}$, whereon adder 29 adds signal $x_i \cdot x_i$ to the output of register 30 and subtracts signal $x_{i-N} \cdot x_{i-N}$ therefrom to obtain autocorrelation function $r_0$ for $j=0$. Autocorrelation functions $r_1, r_2, \ldots, r_p$ for $j=1, 2, \ldots$ p are likewise obtained in other circuits 26-1, 26-2, ..., 26-p, respectively (the number of delay stages is $N-j$). The number of delay stages, however, may be N instead of $N-j$, posing no practical problem since $N>P$ and, in this case, autocorrelation function $r_{j,i}$ is expressed as:

$$r_{j,i} = \sum_{k=i-N+1}^{i} x_k \cdot x_{k-j}$$

which proves to be the same as given in the case shown in FIG. 6.

(B) CALCULATION OF LINEAR PREDICTION COEFFICIENT

Reverting to FIG. 2, p autocorrelation functions $r_{0,i}, r_{1,i}, \ldots, r_{p,i}$ obtained by autocorrelation function computation circuit 10 are sent to linear prediction coefficient calculation circuit 11 which calculates prediction coefficients $a_1, a_2, \ldots, a_p$ by solving the following first-order simultaneous equations wherein $r_{0,i}, r_{1,i}, \ldots, r_{p,i}$ are coefficients.

$$\begin{bmatrix} r_{0,i} & r_{1,i} & r_{2,i} & \cdots & r_{p-1,i} \\ r_{1,i} & r_{0,i} & r_{1,i} & \cdots & r_{p-2,i} \\ r_{2,i} & r_{1,i} & r_{0,i} & \cdots & r_{p-3,i} \\ \vdots & \vdots & \vdots & & \vdots \\ & & & & r_{1,i} \\ r_{p-1,i} & r_{p-2,i} & r_{p-3,i} & \cdots & r_{1,i} & r_{0,i} \end{bmatrix} \begin{bmatrix} a_1 \\ a_2 \\ a_3 \\ \vdots \\ \vdots \\ a_p \end{bmatrix} = - \begin{bmatrix} r_{1,i} \\ r_{2,i} \\ r_{3,i} \\ \vdots \\ \vdots \\ r_{p,i} \end{bmatrix} \quad (8)$$

Given below is the reason why prediction coefficients $a_1, a_2, \ldots, a_p$ may be obtained by solving these equations.

Prediction coefficients $a_1, a_2, \ldots, a_p$ defined as the group of coefficients which minimize the sum of the squares of prediction errors. More specifically, letting $x_k$, $\hat{x}_k$ and $\Delta x_k$ respectively denote the k-th sample, the predicted value of $x_k$ on the basis of p samples immediately preceding $x_k$ and the prediction error, sum E of the squares of the prediction error $\Delta x_k$ may be expressed as follows:

$$E = \sum_{k=-\infty}^{\infty} (\Delta x_k)^2 \quad (9)$$

$$= \sum_{k=-\infty}^{\infty} (x_k - \hat{x}_k)^2$$

$$= \sum_{k=-\infty}^{\infty} \{x_k - (a_1 \cdot x_{k-1} + a_2 \cdot x_{k-2} + \ldots + a_p \cdot x_{k-p})\}^2$$

$$= \sum_{k=-\infty}^{\infty} \left( x_k - \sum_{j=1}^{p} a_j \cdot x_{k-j} \right)^2$$

Setting $a_0 = -1$, $$E = \sum_{k=-\infty}^{\infty} \left( -\sum_{j=0}^{p} a_j \cdot x_{k-j} \right)^2$$

$$= \sum_{k=-\infty}^{\infty} \sum_{j=0}^{p} \sum_{l=0}^{p} a_j \cdot a_l \cdot x_{k-j} \cdot x_{k-l} \quad (10)$$

$$= \sum_{j=0}^{p} \sum_{l=0}^{p} a_j \cdot a_l \cdot c_{j,o} \quad (11)$$

wherein, $$c_{j,o} = \sum_{k=-\infty}^{\infty} x_{k-j} \cdot x_{k-l} \quad (12)$$

Since, as is obvious from Equation (12), $c_{j,o}$ is symmetric with respect to j,l and samples out of the subject interval where $k = i-N+1, i-N+2, \ldots, i$, are rated 0, the following equation is obtained with $j > 1$, $m = k-j$:

$$c_{j,l} = c_{l,j} = \sum_{m=i-N+1}^{i-(j-l)} x_m \cdot x_{m+(j-l)} \quad (13)$$

$$= r_{i,|j-l|}$$

Since, in Equation (11), $a_j$ and $a_l$ minimize value E, the partial differential of E with respect to $a_j$ is 0 as follows.

$$\frac{\partial}{\partial a_j} E = \sum_{l=0}^{p} a_l (c_{jl} + c_{lj}) = 0 \; (j = 1, 2, \ldots, p) \quad (14)$$

Therefore, $$\sum_{l=0}^{p} a_l \cdot r_{i,|j-l|} = 0 \; (j = 1, 2, \ldots, p) \quad (15)$$

which is identical to Equations (8).

Equations (8) may be solved through numerical calculation with a microprocessor (linear prediction coefficient calculation circuit 11 shown in FIG. 2) by the sweeping method of solving a matrix equation or by Levinson's method taking advantage of the symmetry of matrix (Levinson, N: The Wiener RMS Error Criterion in Filter Design and Prediction. J. Math. Phys. 25, 261-278 (1947)). Microprocessor LSI 11/23, for example, takes about 17 msec and 6 msec to solve Equations (8) with FORTRAN program and assembler program, respectively. In a duration of 10 to 40 msec, an audio signal may be regarded as semi-constant so the prediction coefficient is nearly constant and need not be calculated for every sample. Therefore, prediction coefficients $a_1, a_2, \ldots, a_p$ may be renewed every 10 msec (i.e., every 500 samples when the sampling is carried out with sampling frequency of 50 kHz), for example, with an assembler program.

While the prediction coefficient may be calculated on the basis of the autocorrelation functions, it may be alternatively obtained on the basis of self-covariance or PARCOR coefficients (cf. "LINEAR PREDICTION OF AUDIO SIGNAL" by SUZUKI published by CORONA SHA, 1980).

(2) NOISE DETECTION CIRCUIT 2

Noise detection circuit 2 shown in FIG. 1 comprises, as illustrated in FIG. 2 for example, linear predicted value computation circuit 30, prediction error detection circuit 40, threshold value setting circuit 50, comparison circuit 70 and some delay circuits 80 for obtaining synchronism with other circuits. Description of each circuit is given below.

(A) LINEAR PREDICTED VALUE COMPUTATION CIRCUIT 30

Base on p samples $x_{i-1}, x_{i-2}, \ldots, x_{i-p}$ immediately preceding $x_i$ and linear prediction coefficients $a_1, a_2, \ldots, a_p$ obtained in the above described manner, linear predicted value computation circuit 30 calculates predicted value $\hat{x}_i$ of $x_i$ by p registers 31-1, 31-2, ..., 31-p, p multipliers 32-1, 32-2, ..., 32-p and one (1) adder 33 through calculation from the following equation:

$$\hat{x}_i = a_1 x_{i-1} + a_2 x_{i-2} + \ldots + a_p x_{i-p} \quad (16)$$

(B) PREDICTION ERROR DETECTION CIRCUIT 40

Prediction error detection circuit (adder) 40 calculates prediction error $\Delta x_i = x_i - \hat{x}_i$ or difference between predicted value $\hat{x}_i$ and real signal $x_i$.

Real data $x_i$ and predicted value $\hat{x}_i$ is compared with each other as shown in FIG. 8. As will be seen, when the signal is regular, predicted value $\hat{x}_i$ has an almost identical waveform to that of $x_i$ and, therefore, prediction error $\Delta x$ has a very small value. When noise intervenes in the signal, however, the signal partially assumes an irregular form, thus varying prediction error $\Delta x_i$ widely in noise-lying (intervening) wave portions as shown in FIG. 8.

(C) COMPARISON CIRCUIT 70

Prediction error $\Delta x_i$ thus obtained is delayed through delay circuit 80 by N/2 stages and is applied as $\Delta x_h$ (h=i−N/2) to comparison circuit 70 wherein absolute value circuit 71 outputs $|\Delta x_h|$, i.e. absolute value of the prediction error whereas comparator 72 compares $|\Delta x_h|$ and threshold value $L_s$ given by threshold value setting circuit 50, thereby generating noise detection flag $F_N$ when $|\Delta x_h| \geq L_s$. In general, noise covers 10 to 30 samples and noise detection flag $F_N$ fluctuates between ON and OFF states several times for a while as shown in FIG. 8 (d), for example, which is an enlarged view of the result of $t_1 - t_2$ period comparison shown in FIG. 8 (c). Waveform rectifying circuit (edgetrigger monostable multivibrator) 73 is in OFF state for a short period by the rising of noise detection flag $F_N$ as shown in FIG. 8 (e), thereafter maintaining ON state in predetermined retriggering prohibition section $T_o$. Output $T_N$ of waveform rectifying circuit 73 is used to control the cross fader to be described later.

(D) THRESHOLD VALUE SETTING CIRCUIT 50

Threshold value setting circuit 50 is an important circuit that determines the noise detection ability of the device. Prediction error $\Delta x_i$ varies a little, even when input signal $x_i$ is not interposed by noise, depending on the amplitude, the nature of waveform, etc. of input signal $x_i$. More specifically, when a signal has a large amplitude, prediction error $\Delta x_i$ increases in proportion to the amplitude even if the signal is steady whereas, when a signal itself [is not steady, the average level of prediction error $\Delta x_i$ increases. A suitable threshold value Ls therefore needs to be determined for ever-changing signal $x_i$.

Accordingly, threshold value setting circuit 50 is so adapted as to calculate sum Px of the squares of input $x_i$ in a short interval as well as sum P$\Delta$x of the squares of prediction error $\Delta x_i$ in the short interval, thereby obtaining threshold value Ls through a suitable function of these two algebraical sums as follows:

$$\left. \begin{array}{l} P_x = \sum_{k=i-N+1}^{i} x_k^2 \\ P\Delta = \sum_{k=i-N+1}^{i} \Delta x_k^2 \\ L_s = G_3 \cdot \sqrt{G_1 \cdot P_x + G_2 \cdot P\Delta x} \end{array} \right\} \quad (17)$$

Here, $G_1$, $G_2$ and $G_3$ are sensitivity coefficients which are manually varied or fixed considering the nature of input $x_i$. In general $G_3$ may be fixed at about 0.01. $G_1$ and $G_2$ may be each fixed at a suitable value or one of them at 0 in cases where the nature of signal $x_i$ is almost steady (in cases, for example, the tone color, amplitude, and the like vary little as when a single kind of musical instrument is employed).

Circuit 51 in threshold value setting circuit 50 calculates sum $P_x$ of the squares of input $x_i$ in a short interval by successive operations. Multiplier 53 obtains square $x_i^2$ of input signal $x_i$ and delay circuit 54 delays the square by N stages to output $x_{i-N}^2$. Adder 55, in every sampling, cumulatively adds $x_i^2$ to register 56, and subtracts therefrom, output $x_{i-N}^2$ of delay circuit 54, namely, data which have left the subject interval (i−N+1 to i), thus calculating $P_x$ in Equation (17). It should be noted that since $P_x = r_{0,i}$, the signal $r_{0,i}$ from autocorrelation function computation circuit 10 may be used as $P_x$ without utilizing the circuit 51.

Circuit 57 in threshold value setting circuit 50 calculates sum $P_{\Delta x}$ of the squares of prediction error $\Delta x_i$ in a short interval by successive operations. Multiplier 58 calculates square $\Delta x_i^2$ of prediction error $\Delta x_i$ whereas delay circuit 59 delays the square by N stages to output $\Delta x_{i-N}^2$. Adder 60 cumulatively adds $\Delta x_i^2$ in every sampling to register 61 and therefrom subtracts output $\Delta x_{i-N}^2$ of delay circuit 59 in every sampling, thereby calculating $P_{\Delta x}$ in Equation (17).

$P_x$ and $P_{\Delta x}$ thus obtained are each multiplied by sensitivity coefficients $G_1$ and $G_2$ through multipliers 62 and 63, respectively, and added to one another through adder 64 to be outputted therefrom as $G_1 \cdot P_x + G_2 \cdot P_{\Delta x}$. Threshold value output circuit 65 is a numerical table using ROM (read only memory) to calculate threshold value Ls from function $$F_{(z)} = G_3 \cdot \sqrt{z} \quad (z = G_1 \cdot P_x + G_2 \cdot P_{\Delta x}) \quad (18)$$

and supplies the value to said comparison circuit 70.

Threshold value setting circuit 50 may be alternatively arranged as follows:

(a) While threshold value setting circuit 50 shown in FIG. 2 cumulatively adds $\Delta x_i^2$ and $x_i^2$ separately and then adds the sums, threshold value setting circuit 150 shown in FIG. 9 first adds $\Delta x_i^2$ to $x_i^2$ and then performs the cumulative addition so that the cumulative addition is performed commonly and the arrangement of the circuit thereby is simplified.

Prediction error $\Delta x_i$ is squared by multiplier 151 and multiplied by sensitivity coefficient $G_1$ through multiplier 152. Input $x_i$ is squared by multiplier 153 and then multiplied by $G_2$ through multiplier 154. The results thus obtained are added to each other by adder 155 which outputs:

$$G_1 \cdot \Delta x_i^2 + G_2 \cdot x_i^2$$

which is delayed by N stages through delay circuit 156 which in turn outputs:

$$G_1 \cdot \Delta x_{i-N}^2 + G_2 \cdot x_{i-N}^2$$

Adder 157 cumulatively adds the output of adder 155 in register 158 and therefrom subtracts the output of delay circuit 156 in every sampling, thereby outputting:

$$\sum_{k=i-N+1}^{i} (G_1 \cdot x_k^2 + G_2 \cdot \Delta x_k^2)$$

$$= G_1 \cdot \sum_{k=i-N+1}^{i} x_k^2 + G_2 \cdot \sum_{k=i-N+1}^{i} \Delta x_k^2$$

$$= G_1 \cdot P_x + G_2 \cdot P_{\Delta x}$$

From threshold value setting circuit (ROM) 159, threshold value $L_s$ (cf. FIG. (17)) corresponding to the output of register 158 is read out.

Figure 11:
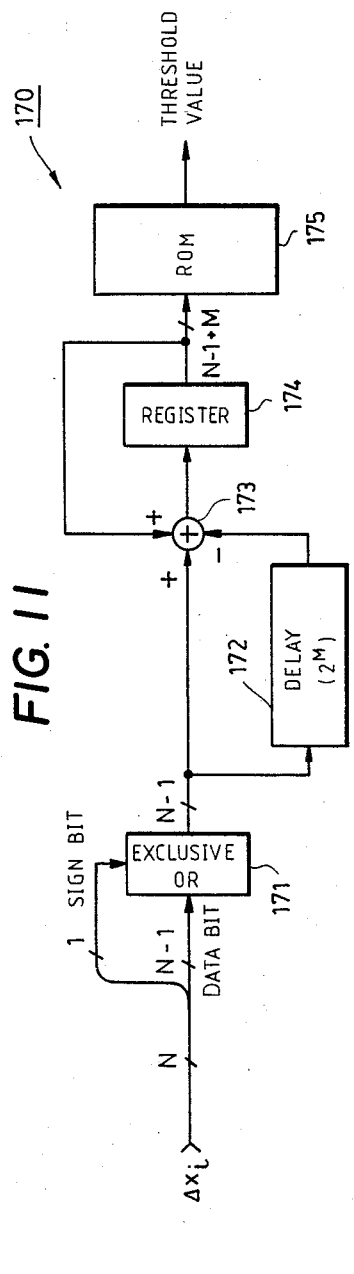
Figure 12:
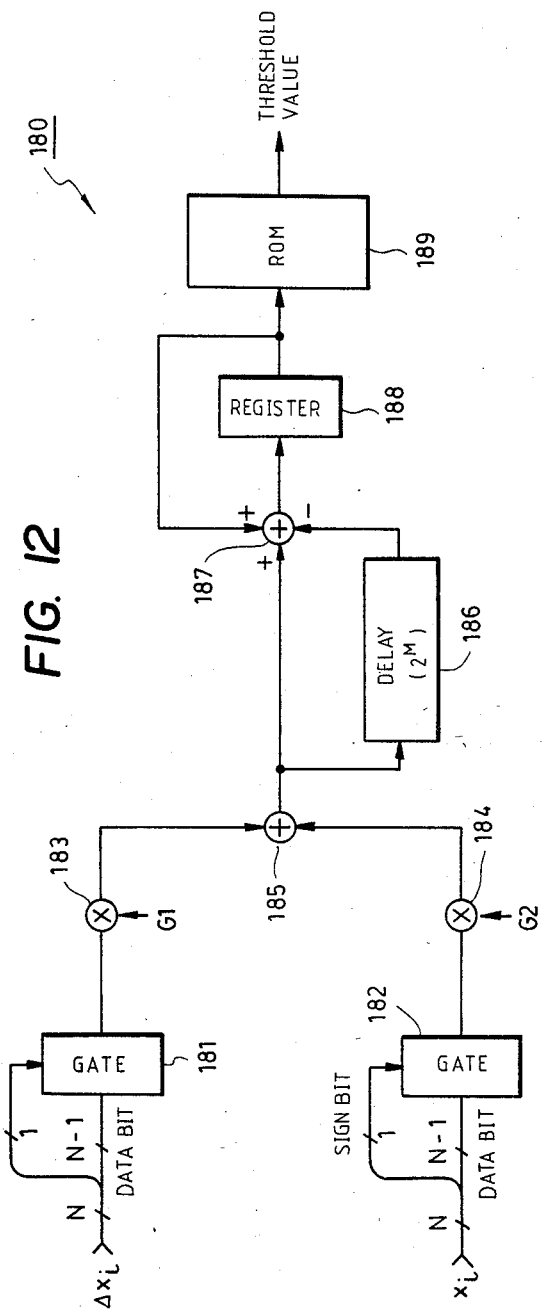

(b) In view of the fact that threshold value setting circuits 50, 150 shown in FIGS. 2, 9, respectively, require expensive multipliers for the squaring operation and a great number of bits in each stage necessarily enlarges the circuit, threshold value setting circuits 160, 170 and 180 shown in FIGS. 10, 11 and 12 are adapted to calculate the threshold value without the squaring operation.

According to this calculation method, data are either half-wave rectified and only data of a positive sign are used or, alternatively, data are full-wave rectified and data of both positive and negative signs are used. Data used may include both input $x_i$ and prediction error $\Delta x_i$ or, alternatively, only one of them. Numerous variations of the calculation method are therefore possible.

(i) Threshold value setting circuit 160 shown in FIG. 10 uses half-wave rectified $\Delta x_i$ as data where $\Delta x_i$ is composed of N bits, one bit being a sign bit and (n−1) bits, data bits. The signal of the data bits is applied to gate 161 which is turned on by the sign bit when the sign bit is 0 (when the data are positive) and turned off by the sign bit when the sign bit is 1 (when the data are negative), thus carrying out half-wave rectification. Delay circuit 162 delays the output of gate 161 by $2^M$ stages. Adder 163 cumulatively adds the output of gate 161 to register 164 and therefrom subtracts the output of delay circuit 162 in every sampling. Then according to the output of register 164, threshold value is read out from threshold value setting circuit (ROM) 165.

(ii) Threshold value setting circuit 170 shown in FIG. 11 uses full-wave rectified $\Delta x_i$ as data. This is a case where the negative numbers of data are represented by the 2's complement. The sign bit ("0" representing (+) and "1", (−)) of $\Delta x_i$ controls exclusive OR gate 171 so as to carry out full-wave rectification such that positive data are outputted as they are whereas negative data are outputted as an absolute value.

Delay circuit 172 delays the output of exclusive OR circuit 171 by $2^M$ stages. Adder 173 cumulatively adds the output of exclusive OR circuit 171 to register 174 and therefrom subtracts the output of delay circuit 172. The threshold value is read from ROM 175 by the output of register 174.

Where data are represented by a sign magnitude, the full-wave rectification is carried out by taking out only data bits as they are.

(iii) In threshold value setting circuit 180 shown in FIG. 12, half-wave rectified $x_i$ and half-wave rectified $\Delta x_i$ are both used.

Similarly to the example shown in FIG. 10, $\Delta x_i$ and $x_i$ are half-wave rectified by and gates 181, 182, multiplied by $G_1$, $G_2$ through multipliers 183, 184, respectively and added to each other by adder 185. Adder 187 cumulatively adds the output of adder 185 to register 188 while subtracting therefrom the output (output of adder 185 delayed by $2^M$ stages) of delay circuit 186. The threshold value is read from ROM 189 by the output of register 188.

(E) DELAY CIRCUIT 80

Figure 2B:
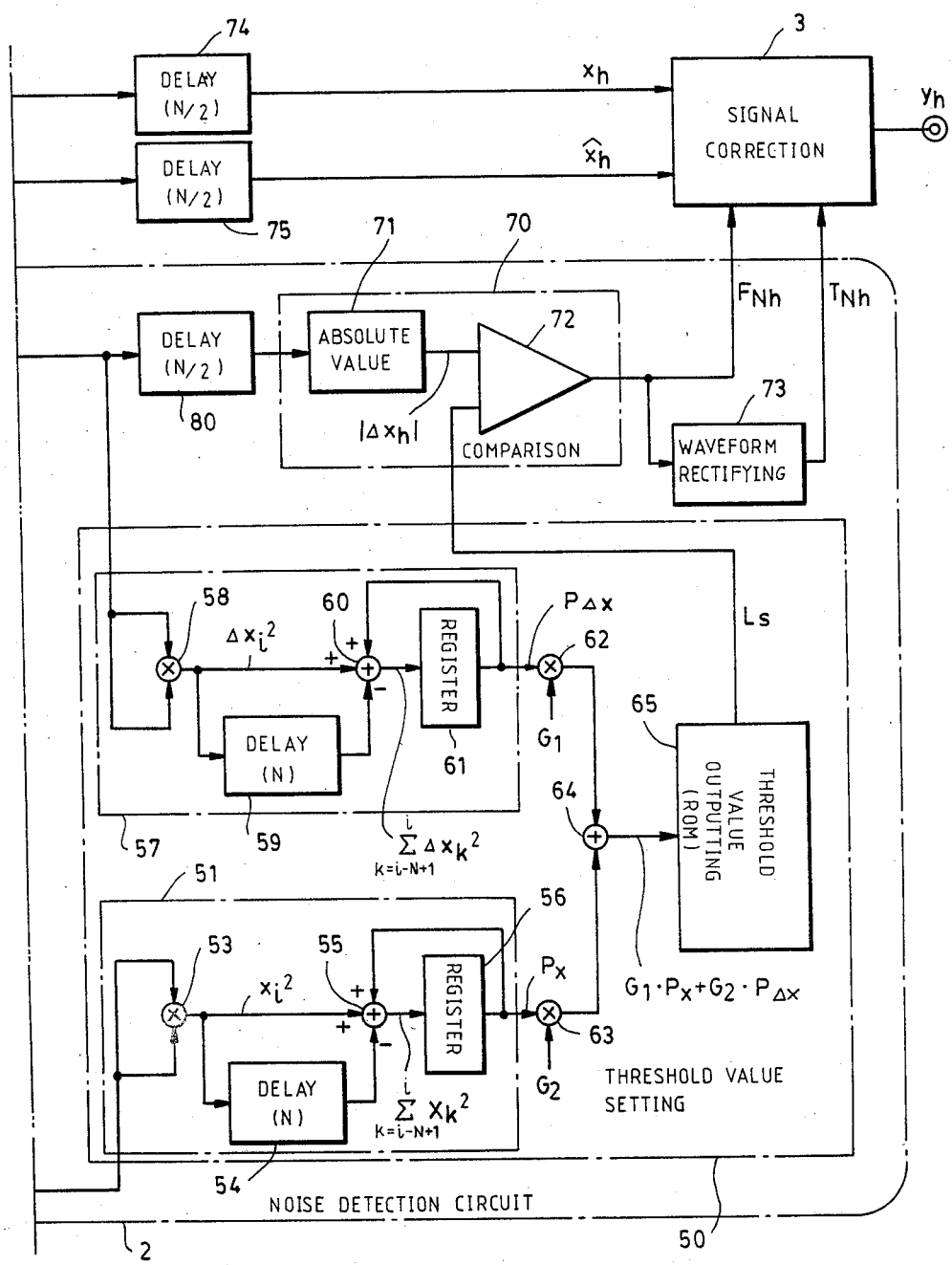
Figure 13:
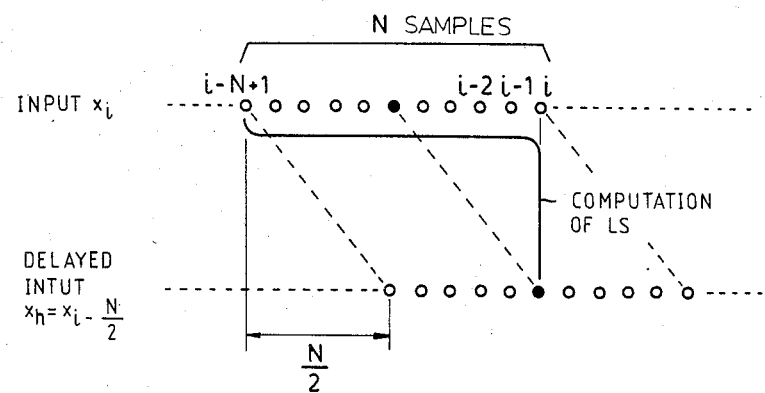
FIG. 13 is a view describing the timing by which the calculated threshold value is applied to the samples.

N/2−stage delay circuit 80 is provided on the input-side of comparison circuit 70 (both shown in FIG. 2B) in order to apply the sample of $|\Delta x_h|$ which is compared with threshold value Ls to the sample (as indicated by the mark 500 in FIG. 13) located in the middle of N samples used to obtain Ls which is calculated at time i as shown in FIG. 13. Delay circuit 80 is provided to apply threshold value Ls obtained on the basis of N samples to all of said N samples. Through such delaying process, proper comparison is possible with regard to the N samples used to obtain Ls. More weight may be placed either toward the foremost or last part of the series of successively continuing samples by setting the number of delay stages at other than N/2. For example, more weight may be placed toward the last part of the samples by setting the number of delay stages at N/4. Delay circuits 74, 75 shown in FIG. 2 are provided to obtain synchronism with delay circuit 80 so that both circuits 74, 75 effect N/2-stage delaying.

(3) SIGNAL CORRECTION CIRCUIT

Figure 14A:
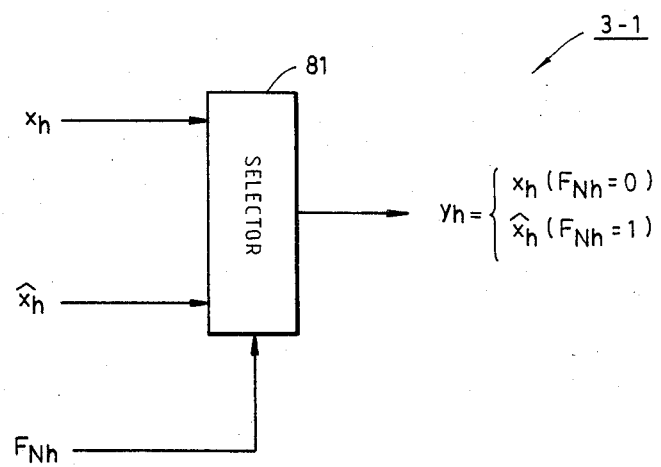
FIG. 14 (a), (b) are block diagrams showing an example of conventional signal correction circuit.

Signal correction circuit 3 shown in FIG. 2 generates a suitable substitution signal $x_h'$ to replace input signal $x_h$ when noise has been detected in input signal $x_h$. Various methods are available to produce substitution signal $x_h'$ and switch between input signal xh and substitution signal $x_h'$. (a) A signal correction circuit which has been commonly used is shown in FIG. 14. Signal correction circuit 3-1 shown in FIG. 14 (a) uses predicted value xobtained in noise detection circuit 2 as substitution signal $x_h'$(FIG. 2 shows such example). Selector 81 outputs input signal $\hat{x}_h$ as it is when noise is not present, i.e., $F_{Nh}=0$, and outputs substitution signal $x_h$ when noise is present, i.e., $F_{Nh}=1$.

Signal correction circuit 3-2 shown in FIG. 14 (b) uses the following linear coupling of the preceding and succeeding sample values:

$$x'_h = 1/6\{-x_{h-2} + 4x_{h-1} + 4x_{h+2}\} \quad (19)$$

as a substitution signal. In this circuit, input signal $x_h$ is shifted in every sampling through registers 82 to 85 successively, each of these registers outputting signals $x_{h-1}$, $x_{h-2}$, $x_{h-3}$ and $x_{h-4}$, respectively. In this case, substitution signal $x_{h-2}'$ is produced on the basis of sample values $x_{h-3}$, $x_{h-4}$ which precede sample values $x_{h-2}$ and samples $x_{h-1}$, $x_h$ which follow sample vlaue $x_{h-2}$ as follows:

$$x_{h-2}' = 1/6\{-x_h + 4x_{h+1} + 4x_{h+3} - x_{h+4}\}$$

which corresponds to 2 stages delayed $x_h'$ in Equation (19). Noise detection flag $F_{Nh}$ is delayed by 2 stages by registers 86, 87 and outputted as $F_{Nh-2}$.

While above two methods are very effective for noise which is present in a single sample point much effect may not be expected for noise extending over 10 to 30 sample points as shown in FIG. 8.

Figure 15A:
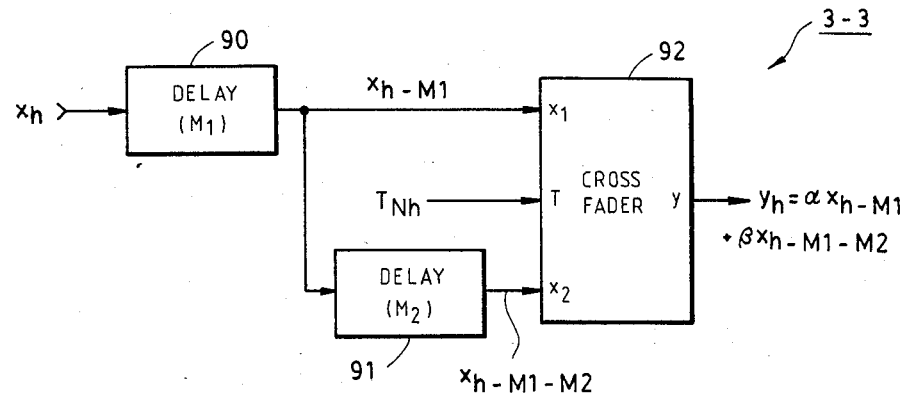
FIG. 15 (a) is a block diagram showing an example of signal correction circuit which uses for a substitution signal the signal from which noise is not eliminated.
Figure 15B:
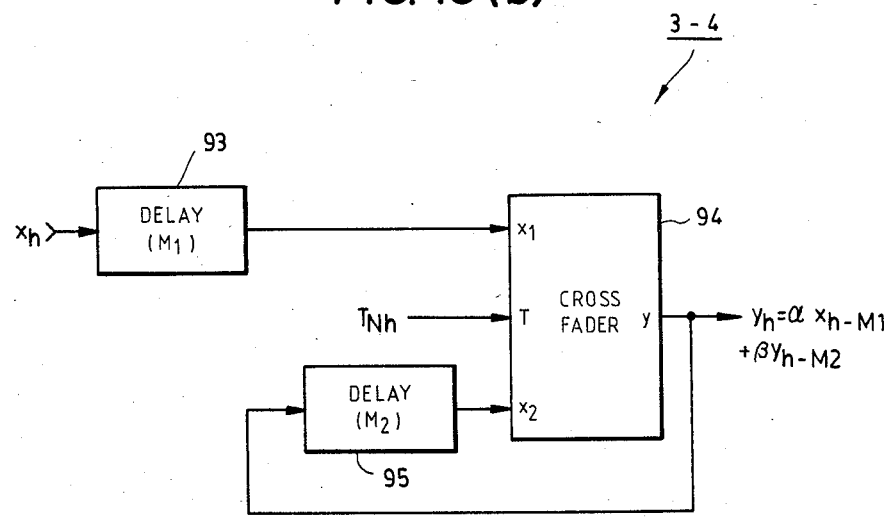

(b) FIG. 15 shows a novel signal correction circuit. In this circuit, the signal in the vicinity of noise is used as a substitution signal.

Signal correction circuit 3-3 shown in FIG. 15 (a) uses as a substitution signal the prior-to-noise and close-to noise interval of the signal from which the noise is not eliminated. More specifically, delay circuit 90 delays input signal $x_h$ by $M_1$ stages to produce signal $x_{h-M_1}$ which signal is further delayed by delay circuit 91 by $M_2$ stages to produce substitution signal $x_{h-M_1-M_2}$ (delay circuit 90 is provided to ensure that the switching of signal be carried out at a location of the signal prior to the noise intervention (see FIG. 18)). Input signal $x_{h-M_1}$ and substitution signal $x_{h-M_1-M_2}$ are added to cross fader 92 (signal switching circuit to be described later). Cross fader 92 is excited by noise detection trigger $T_{Nh}$ (see FIG. 8 (e)) and leads $Y_h = \alpha x_{h-M_1} + \beta x_{h-M_1-M_2}$ ($0 \leq \alpha \leq 1$, $0 \leq \beta \leq 1$, $\alpha + \beta \leq 1$) to output terminal y by gradually attenuating the input to terminal $x_1$ while gradually increasing the input to terminal $x_2$, thereby smoothly substituting substitution signal $x_{h-M_1-M_2}$ for the noise-interposed portion of signal $x_{h-M_1}$. After a given time has elapsed, cross fader 92 gradually increases the input to terminal $x_i$ while gradually attenuating the input to terminal $x_2$ so as to feed its output $y_h$ back to $x_{h-M_1}$ again when a given period $T_{xF}$ has passed since it was triggered, thus eliminating the noise from signal $x_{h-M_1-M_2}$.

Figure 16:
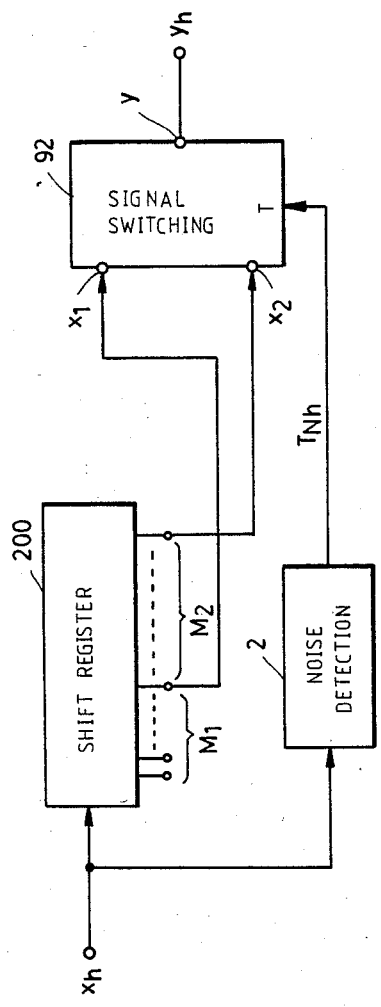
FIGS. 16 and 17 are circuit diagrams showing examples of a delay circuit employed in the embodiment.
Figure 17:
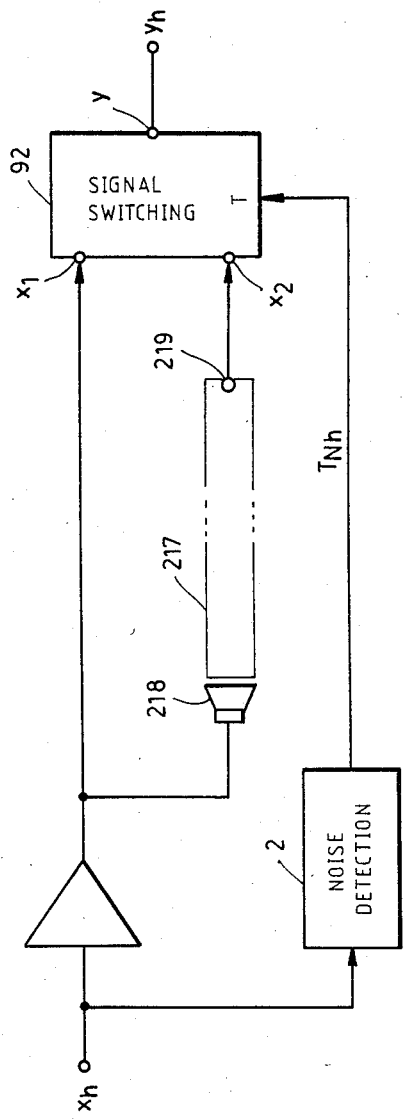
Figure 18:
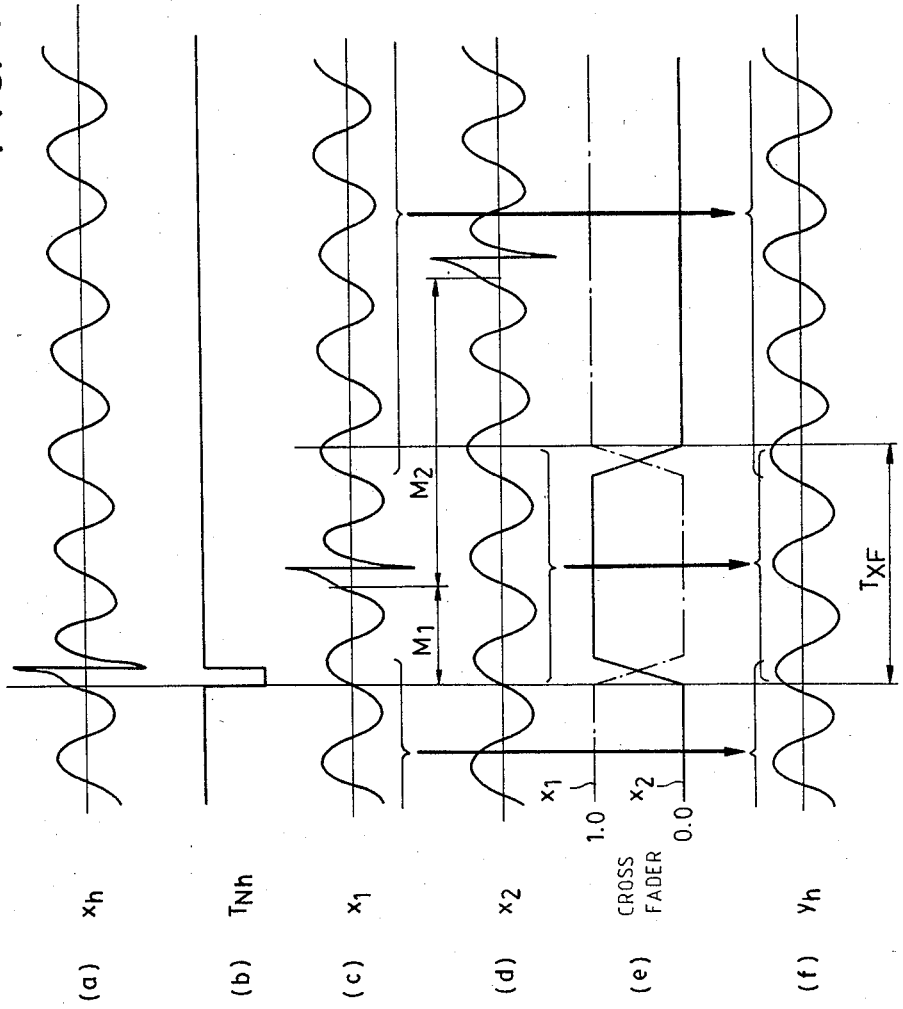
FIG. 18 comprising

Examples of operation by the circuit shown in FIG. 15 (a) are illustrated in FIG. 18, where FIG. 18 (e) shows the ratio of the input to terminal $x_1$ and the input to terminal $x_2$ which are transmitted to output terminal y via cross fader 92. Signal switching operation starts a little before noise mixing takes place so several tens of samples preceding and succeeding the noise-interposed sample are all replaced by noise-free substitution signal $x_{h-M_1-M_2}$. Replacement by the neighboring signal of a like nature enables a remarkably good control over noise to be realized by a simple circuit arrangement. Signal substitution period $T_{xF}$ may be provided according to the noise intervention period during which the particular noise to be eliminated most frequently interferes with audio signal. Number $M_2$ of delay stages to be effected by delay circuit 91 may be determined such that $(M_1+M_2)$ delay stages, where $M_1$ is the number of delay stages secured by delay circuit 90, is a little longer than period $T_{xF}$. Since delay circuits 90, 91 delay input signal $x_h$ successively, these circuits may be replaced for simplification by a single delay circuit (shift register) 200 shown for example in FIG. 16, which is adapted to secure the total delay stages of $(M_1+M_2)$ with a tap provided at an $M_1$-stage therein. For an analog signal, the delaying operation may be performed by acoustic pipe 217 (speaker 218, microphone 219) shown in FIG. 17 or by bucket brigade device.

In signal correction circuit 3-4 shown in FIG. 15 (b), the output signal, which is already free from noise, is delayed instead of the input signal for the reason that when, in signal correction circuit 3-3 shown in FIG. 15 (a), two noises intervene in the signal, one close to the other, the first noise may happen to be used as a substitution signal for the second noise, noise thus surviving in the substitution signal. In circuit 3-4 shown in FIG. 15 (b), $M_1$-stage delay circuit 93 is provided to ensure that the switching of signal be carried out before the noise intervention takes place, similar to delay circuit 90 shown in FIG. 15 (a). Cross fader 94, similarly to cross fader 92 shown in FIG. 15 (a), is excited by noise detection trigger $T_{Nh}$ to perform a gradual inputs-switching operation between the inputs to terminals $x_1$ and $x_2$. Output $Y_h$ of cross fader 94 is $M_2$ stages delayed by delay circuit 95 and fed back to terminal $x_2$.

Figure 19:
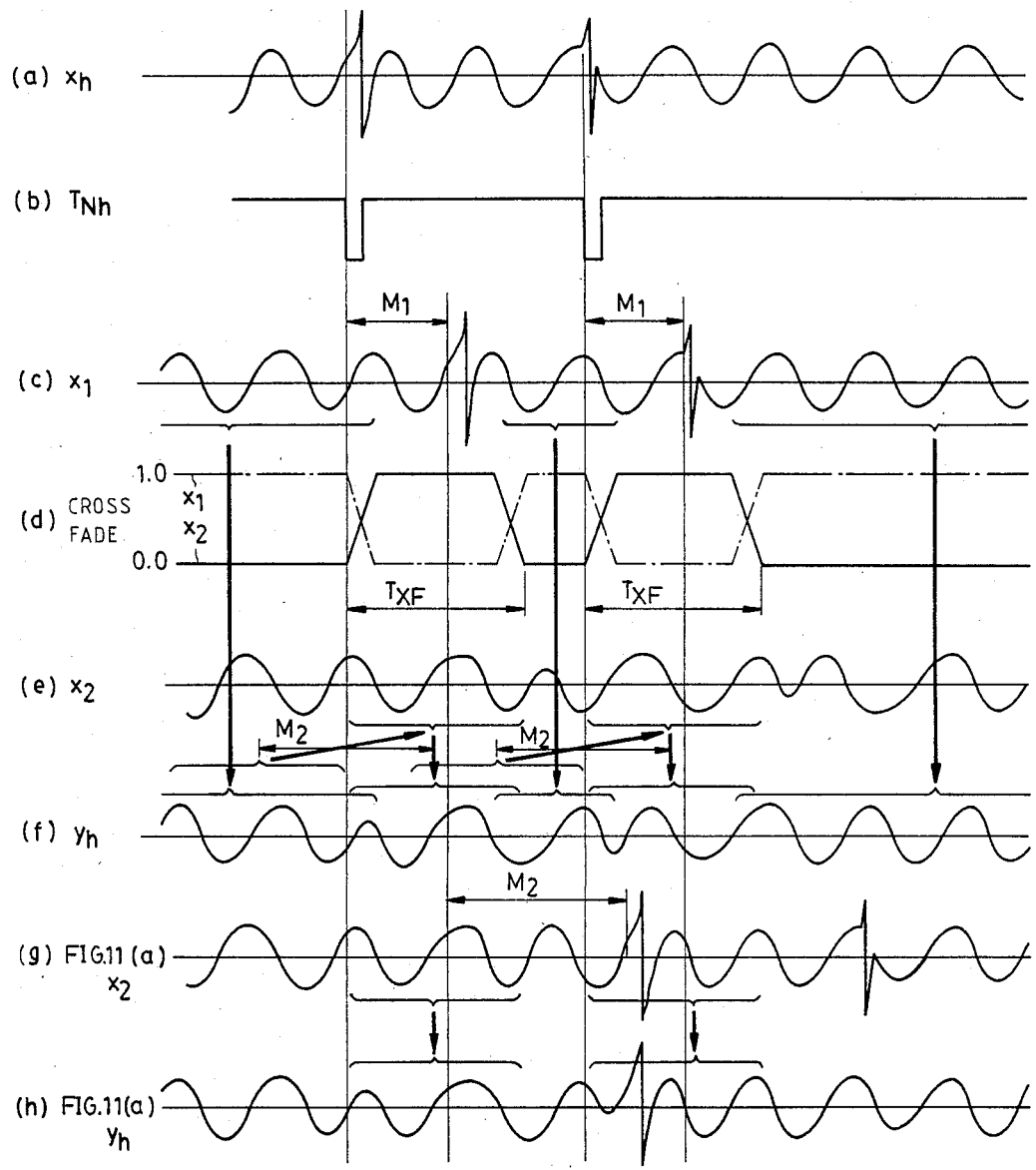
FIG. 19 comprising

FIG. 19 (a) to (f) illustrate an example of operation by the circuit shown in FIG. 15 (b). Cross fader 94 is excited whenever noise detection trigger $T_{Nh}$ is applied thereto. The ratio of the inputs to terminals $x_1$ and $x_2$ directed to terminal y is shown in FIG. 19 (d). The input to terminal $x_1$ corresponds to $y_{h-M_2}$ or $M_2$ stages delayed output $Y_h$. In other words, output $Y_h$ in the noise-interposed portion is replaced by $Y_h$ itself appearing $M_2$ stages ahead. Therefore, when noises are close to each other as shown in FIG. 19, the first substitution signal also serves as the second substitution signal, output $Y_h$ (see FIG. 19 (f)) being thus free from both noises. This is not the case in the circuit shown in FIG. 15 (a) where the first noise appears in the second portion of the input (second substitution signal) to terminal $x_2$ as illustrated in FIG. 19 (g) so that the noise survives in output $Y_h$ as shown in FIG. 19 (h).

Cross faders 92, 94 shown in FIG. 15 (a), (b) are adapted to prevent noises occurring in switching of signals. More specifically, since switching by an analog switch generates a secondary noise due to the level difference between the original signal and the substitution signal, the switching operation is gradually carried out in these cross faders (by increasing one of the signals while attenuating the other).

Figure 20:
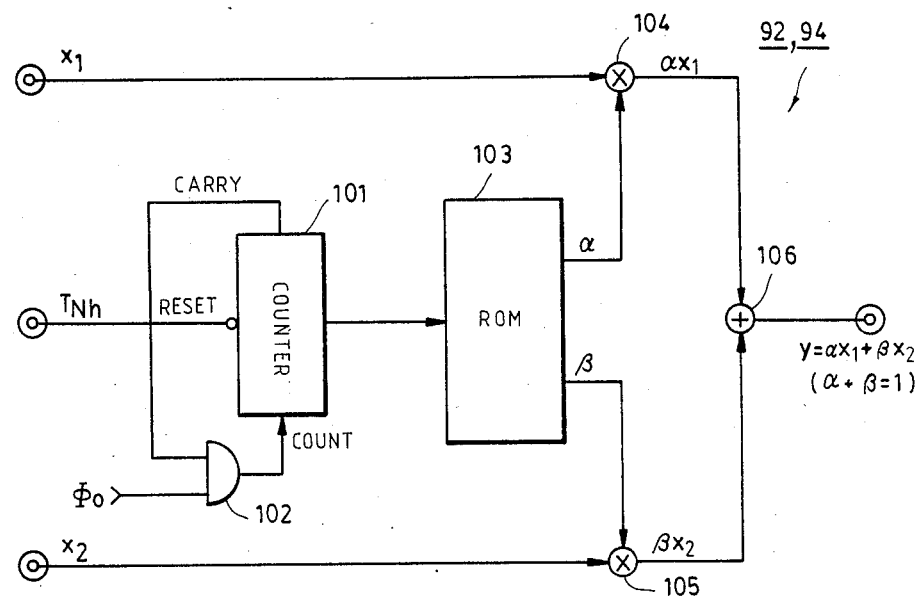
FIG. 20 is a block diagram showing an example of cross fader.

FIG. 20 shows examples of cross faders 92, 94 comprising counter 101, AND gate 102, ROM 103, two multipliers 104, 105 and one adder 106. The counter 101 is reset by noise detection trigger $T_{Nh}$ and starts counting up by a fixed clock $\Phi_0$ (relatively slow clock used for a cross fader) and continues it until it gives out a carry output at a maximum count of $M_3$ thereby to turn off gate 102 thereupon the counter 101 stop counting. ROM 103 successively outputs coefficients $\alpha$, $\beta$ written therein with the count by counter 101 being used as address. For each count, coefficients $\alpha$, $\beta$ are given the values as indicated, for example, in Table 1 below.

TABLE 1

| Count | | | | | | | | | | | |
|---|---|---|---|---|---|---|---|---|---|---|---|
| 1 | 2 | ... | 9 | 10 | 11 | ... | ... | 50 | 51 | 52 | ... 59 60 |
| $\alpha$ | 1.0 0.9 | ... | 0.1 | 0.0 | 0.0 | ... | ... | 0.0 | 0.1 | 0.2 | ... 0.9 1.0 |
| $\beta$ | 0.0 0.1 | ... | 0.9 | 1.0 | 1.0 | ... | ... | 1.0 | 0.9 | 0.8 | ... 0.1 0.0 |

Figure 21:
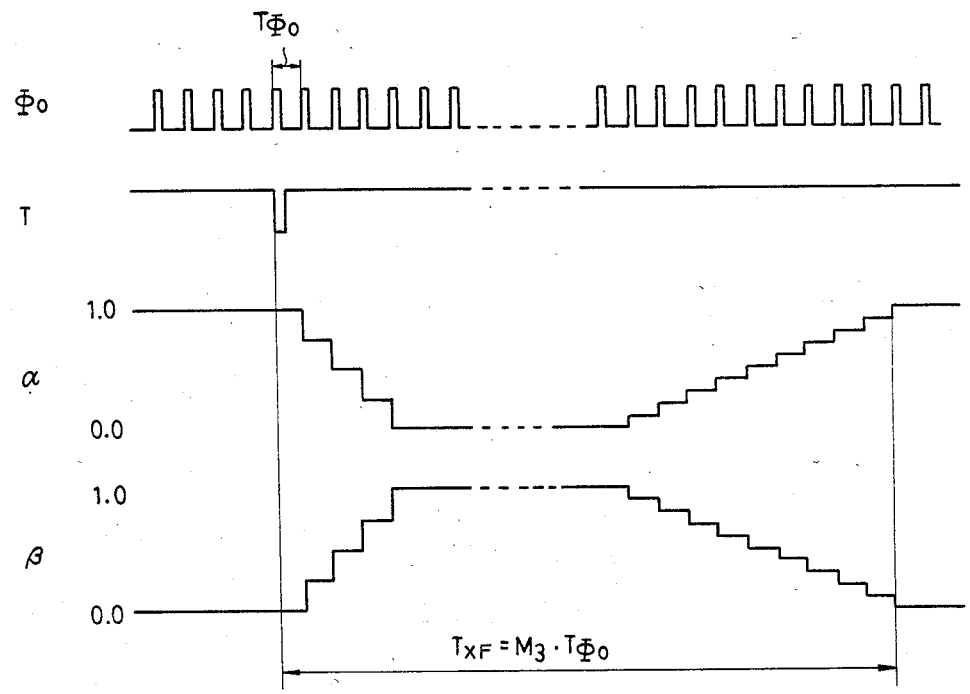
FIG. 21 illustrates waveforms given in the circuit shown in FIG. 20.

As will be seen, $\alpha$ and $\beta$ each vary as $1 \to 0 \to 1$, $0 \to 1 \to 0$ by degrees while maintaining the relation $\alpha + \beta = 1$. While, in this case, $\alpha$ and $\beta$ have the starting slope equal to the ending slope, the starting and ending slopes may be different as shown in FIG. 21 or may be non-linear. The product of maximum count $M_3$ of counter 101 and period $T_{\Phi 0}$ of clock $\Phi_0$ corresponds to the cross-fading period $T_{xF}$.

In FIG. 20, the input to terminal $x_1$ is multiplied by said coefficient $\alpha$ through multiplier 104 whereas the input to terminal $x_2$ is multiplied by coefficient $\beta$ through multiplier 105. Adder 106 adds the two products and leads the sum $\alpha x_1 + \beta x_2$ to output terminal y. Thus, terminal y gives out a signal wherein the ratio of $x_1$ and $x_2$ gradually varies.

Figure 22:
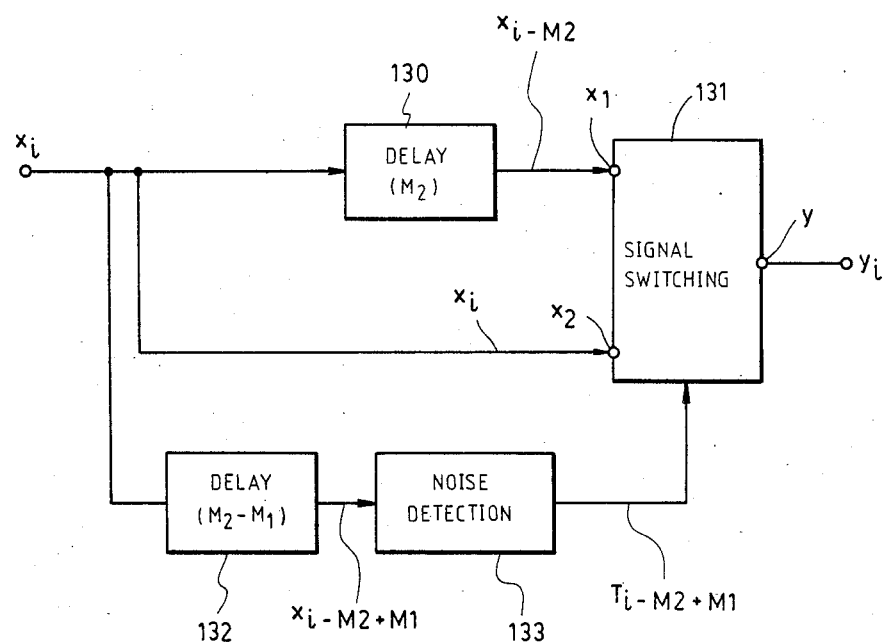
FIG. 22 is a block diagram schematically showing another embodiment of the invention.

FIG. 22 shows another embodiment of the present invention wherein the original signal is used as a substitution signal as in the case of the embodiment shown in FIG. 1. In particular, a noise-succeeding portion of the original signal is used as a substitution signal in this embodiment.

In FIG. 22, input signal $x_i$ is by $M_2$ stages delayed by delay circuit 130 and added to terminal $x_1$ of signal switching circuit 131 on one hand while input signal $x_i$ is also added, as it is, to terminal $x_2$ of signal switching circuit 131 on the other. Delay circuit 132 delays input signal $x_i$ by ($M_2-M_1$) stages to produce signal $x_{i-M_2+M_1}$. Delay circuit 132 is provided to ensure that the signal substitution be initiated at a time point of the signal which precedes the noise by M1 stages. Noise detection circuit 133 detects noise present in output $x_{i-M_2+M_1}$ of delay circuit 133 and generates noise detection trigger $T_{i-M_2+M_1}$ upon rising of the output $x_{i-M_2+M_1}$.

Signal switching circuit 131 outputs input signal to the terminal $x_1$ while noise detection trigger $T_{i-M_2+M_1}$ is not generated and outputs input signal to the terminal $x_2$ for period $T_{xF}$ upon generation of trigger $T_{i-M_2+M_1}$. The noise-interposed portion of the input to terminal $x_1$ is thus replaced by the noise-succeeding portion of the input to terminal $x_2$, thereby eliminating noise from the signal.

Figure 23:
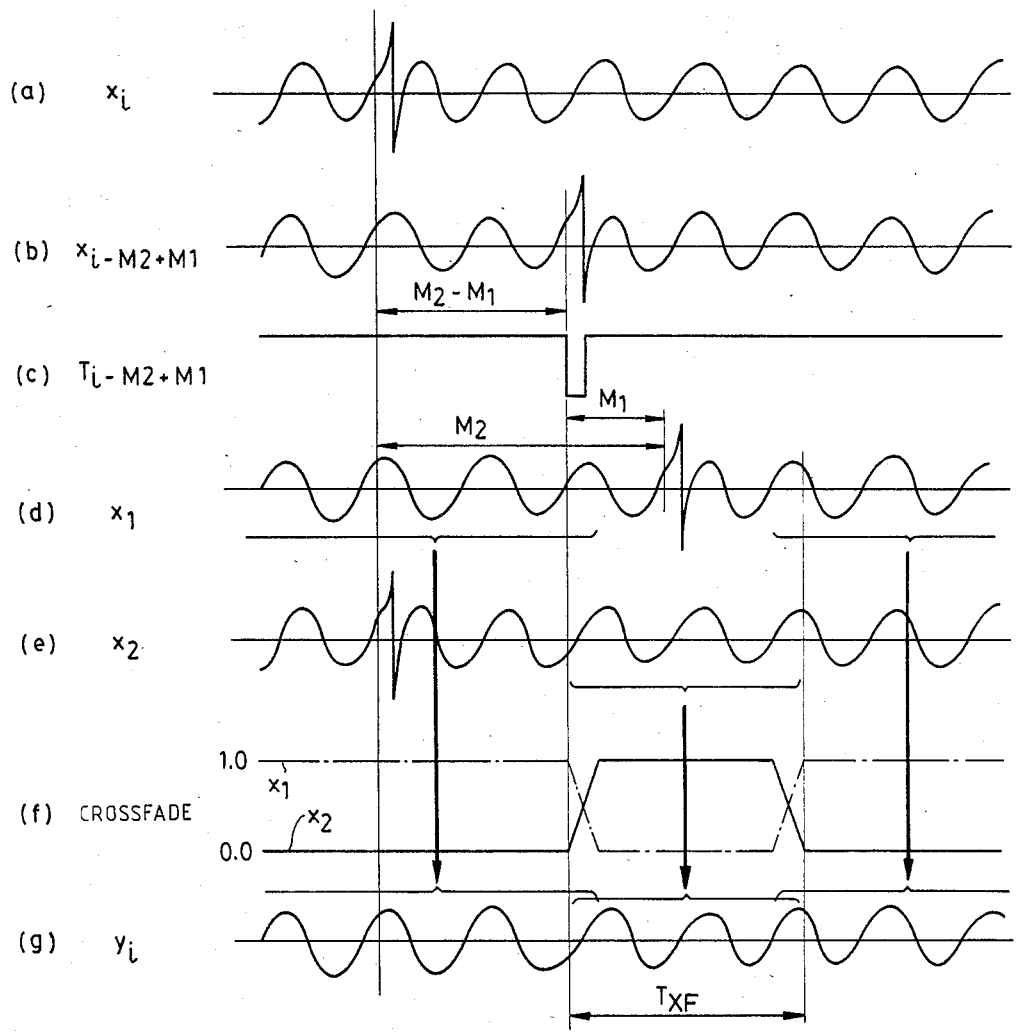
FIG. 23 comprising

FIG. 23 illustrates an example of operation by the circuit shown in FIG. 22. Since the input to terminal $x_1$ corresponds to $M_2$ stages delayed input signal $x_i$ and noise detection trigger $T_{i-M_2+M_1}$ is generated ($M_2-M_1$) stages later than the occurrence of noise intervention in input signal $x_i$, signal switching circuit 131 starts signal substitution $M_1$ stages earlier than the occurrence of noise intervention in input signal $x_i$, outputting input signal to the terminal $x_2$ for a period $T_{xF}$. Thus, the signal from signal switching circuit 131 is free from noise as shown in FIG. 23 (g).

Figure 24:
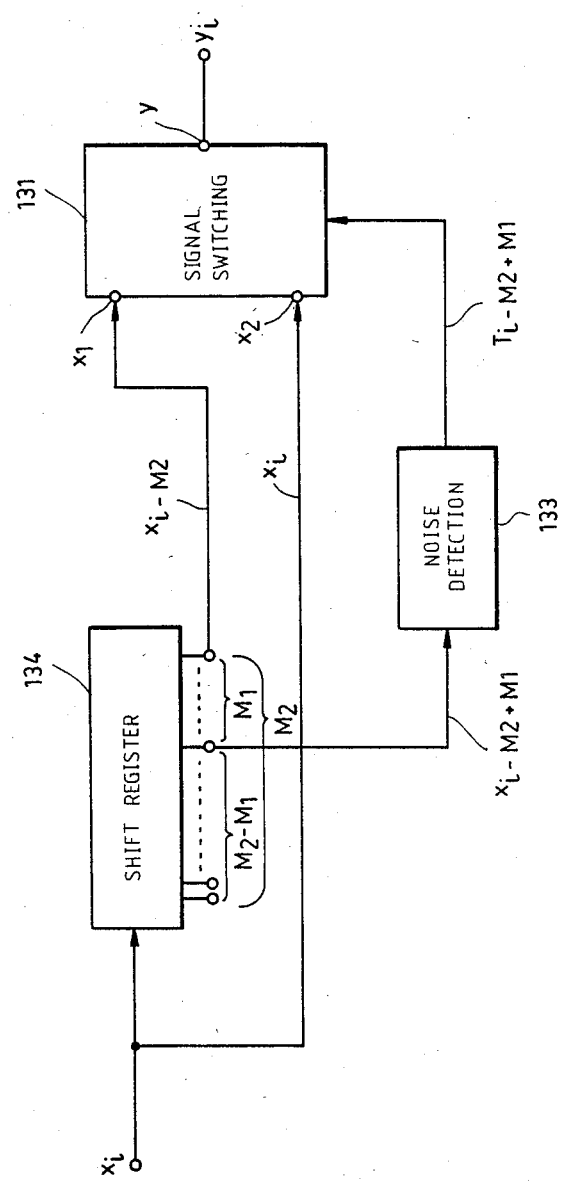
FIG. 24 is a block diagram showing an example of a delay circuit employed in this embodiment.

Delay circuits 130, 132 may be replaced by a series of shift registers in this embodiment also, as shown in FIG. 24. In that case, shift register 134 adapted to carry out delaying for $M_2$ stages as a whole may be used such that, as shown in FIG. 24, $M_2$ stages delayed $x_i$ is led therefrom to terminal $x_1$ whereas ($M_2-M_1$) stages delayed $x_i$ is taken therefrom and applied to noise detection circuit 133.

Figure 25A:
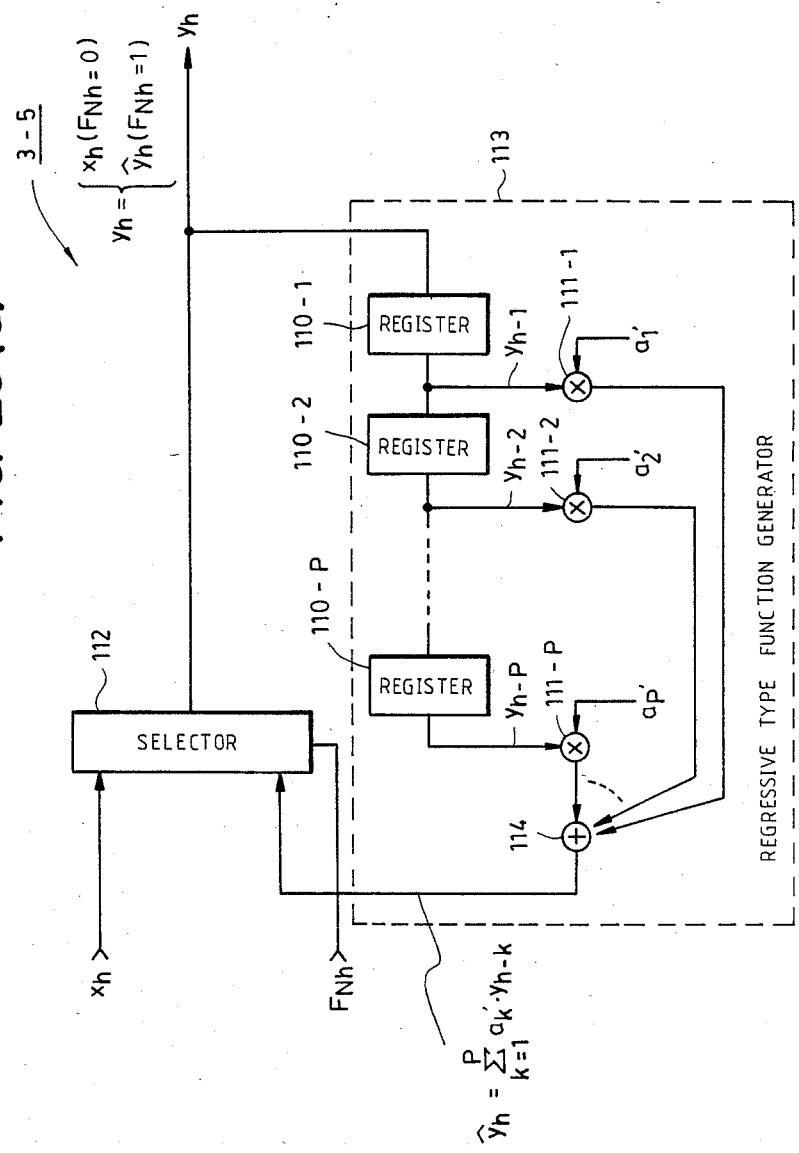
FIG. 25 (a) is a block diagram showing an example of signal correction circuit producing a substitution signal by the regression operation of the output.
Figure 25B:
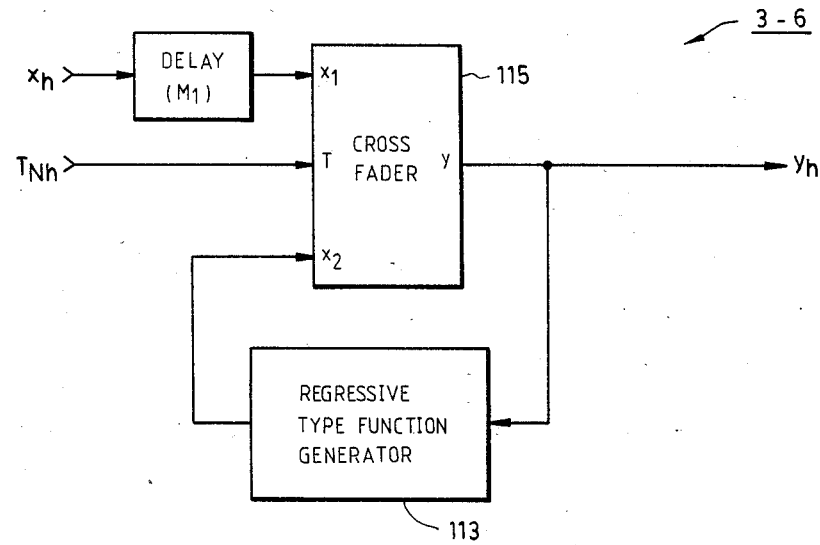

(c) FIG. 25 (a) shows signal correction circuit 3-5 which is another example of signal correction circuit 3. The signal correction circuit 3-5 is adapted to produce a substitution signal by a regression computation circuit adopting some of the sample values as the initial value. Output $y_h$ of selector 112 is added to regressive type function generator 113 wherein registers 110-1, 110-2, ..., 110-p successively shift $y_h$ to output $y_{h-1}, y_{h-2}, ..., y_{n-p}$, respectively, which are multiplied by regression coefficients $a_1', a_2', ..., a_p'$, respectively through multipliers 111-1, 111-2, ..., 111-p and added together by adder 114, which outputs linear coupling value $\hat{y}_h$ of the past p samples of output $y_h$ as the substitution signal as expressed in the following formula:

$$\hat{y}_h = \sum_{k=1}^{p} a_k' \cdot y_{h-k} \tag{20}$$

This signal $y_h$ is selected by selector 112 when noise detection flag $F_{Nh}$ is "1". The above operation is repeated so long as noise detection flag $F_{Nh}$ remains to be "1". The waveform of output $y_h$ at this time is known by examining the difference expression of Equation (20)

$$y = \sum_{k=1}^{p} a_k' (D^k \cdot y) \tag{21}$$

wherein D represents delay operator. The characteristic equation of Equation (21) is:

$$1 - \sum_{k=1}^{p} a_k' \lambda^k = 0 \tag{22}$$

It will be seen that output $y_h$ is a result of self-exciting oscillation having the root of this equation as a complex circular frequency.

In fact, considering a case where the sum of two kinds of attenuating sinusoidal waves such as shown below is generated as the substitution signal, $$\hat{y}_h = A_1 \cdot e^{-\alpha_1 h} \cdot \sin\omega_1 h + A_2 \cdot e^{-\alpha_2 h} \cdot \sin\omega_2 h \tag{23}$$

the oscillated frequencies are:

$$z_{1,2} = -\alpha_1 \pm j\omega_1$$

$$z_{3,4} = -\alpha_2 \pm j\omega_3 \text{ (where } j^2 = -1\text{)} \tag{24}$$

The characteristic equation thereof is:

$$(\lambda^2 + 2\alpha_1\lambda + \alpha^2 + \omega_1^2)(\lambda^2 + 2\alpha_2\lambda + \alpha_2^2 + \omega_2^2) = 0.$$

Comparing this equation with Equation (22), it will be seen that the following values may be adopted for regression coefficients $a_1', a_2', ...$.

$$\left.\begin{array}{l} a_1' = \dfrac{2\alpha_1(\alpha_2^2 + \omega_2^2) + 2\alpha_2(\alpha_1^2 + \omega_1^2)}{(\alpha_1^2 + \omega_1^2)(\alpha_2^2 + \omega_2^2)} \\[6pt] a_2' = \dfrac{\alpha_1^2 + \omega_1^2 + \alpha_2^2 + \omega_2^2 + 4\alpha_1 \cdot \alpha_2}{(\alpha_1^2 + \omega_1^2)(\alpha_2^2 + \omega_2^2)} \\[6pt] a_3' = \dfrac{2\alpha_1 + 2\alpha_2}{(\alpha_1^2 + \omega_2^2)(\alpha_2^2 + \omega_2^2)} \\[6pt] a_4' = \dfrac{1}{(\alpha_1^2 + \omega_2^2)(\alpha_2^2 + \omega_2^2)} \\[6pt] a_i' = 0 \; (i > 4) \end{array}\right\} \tag{25}$$

Given these coefficients $a_1', a_2', ...$, the function in Equation (23) is determined, the initial value being output $Y_i$ of the past four terms starting at the time when noise detection flag $F_{Nh}$ turns "1". In general, p coefficients $a_1', a_2', ..., a_p'$ cause p/2 damped oscillations.

In a short signal interval, the best approximation may be obtained by using prediction coefficients $a_1', a_2', ..., a_p'$, which are also used in noise detection, as regression coefficients $a_1', a_2', ..., a_p'$. This, is however, not necessarily true in cases where the circuit operation is repeated over 30 to 50 samples since the operation result then could increase abnormally depending on the initial value, with the result that the rear edge of the substitution signal does not naturally connect with the signal to be replaced.

This may be avoided by using prediction coefficients $a_1, a_2, \ldots, a_p$ multiplied by weights $b_1, b_2, \ldots, b_p$, respectively as follows:

$$\left.\begin{array}{l} a_1' = a_1 \times b_1 \\ a_2' = a_2 \times b_2 \\ \vdots \\ a_p' = a_p \times b_p \end{array}\right\} \quad (26)$$

Weights $b_1, b_2, \ldots, b_p$ are determined according to the characteristics of the input signal. In fact, $b_1, b_2, b_3, \ldots$ may be each fixed at about $0.99, 0.98, 0.95, \ldots$, respectively in order for them to be sufficiently effective.

Alternatively, several groups of regression coefficients $a_1', a_2', \ldots, a_p'$ may be kept as a numerical table in CPU or ROM, from which a suitable group is manually selected or automatically selected according to the signal. The simplest way would be to fixedly set $a_1'=0.99, a_2'=a_3'=\ldots=a_p'=0$, whereby a waveform is obtained which is exponentially damped starting from the sample immediately before the one at which noise has been detected. Thus, a better result, is obtained as compared with the result by the conventional method.

Signal correction circuit 3-6 shown in FIG. 25 (b), which is a combination of regressive type function generator 113 as shown in FIG. 25 (a) and cross fader 115 as shown in FIG. 15 (a), enables the switched signals to be smoothly connected and enjoys enhanced noise control ability as compared with its counterpart shown in FIG. 25 (a).

Figure 26:
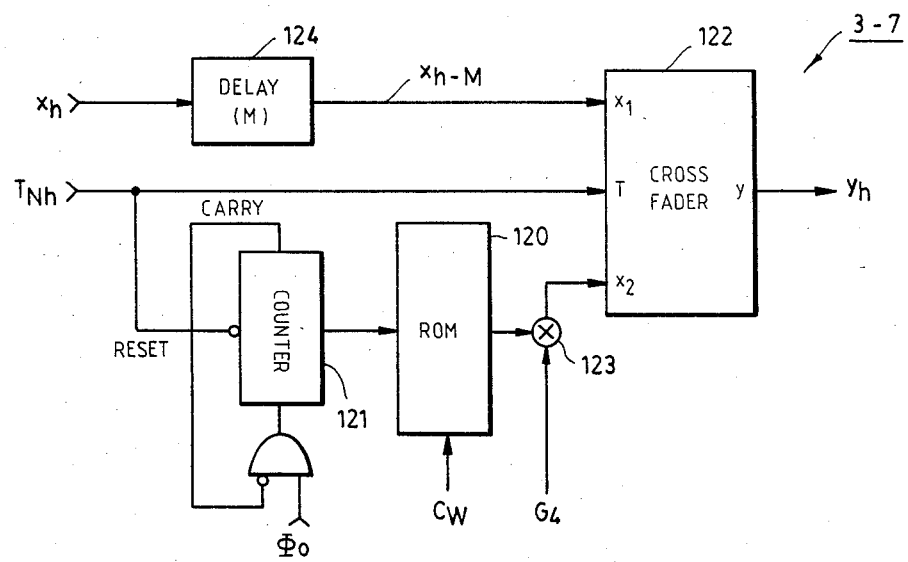
FIG. 26 is a block diagram showing an example of signal correction circuit selecting a substitution signal from the memorized waveforms.

(d) FIG. 26 shows still another example of signal correction circuit 3. Signal correction circuit 3-7 shown has several different substitution signal waveforms stored therein from which a suitable waveform is selected according to the input signal upon occurrence of noise and used for substitution with its amplitude adjusted. ROM 120 in this circuit has in itself stored, e.g., 16 typical waveforms of input signal $x_h$ which vary in shape, cycle, etc. Each of those waveforms are therein stored as data obtained through, e.g., 64 samplings in the section corresponding to cross fading period $T_{xF}$ (ROM in this case has only to have a capacity of $64 \times 14$, that is, 1K words at most).

Counter 121 is reset in response to trigger $T_{Nh}$ and starts counting up by fixed clock $\Phi_0$. ROM 120 outputs a waveform from address using the count thus given. Counter 121 stops counting when it has completed counting of a predetermined number of samples (e.g. 64) of the waveform. In place of counter 121, the counter provided in cross fader 122 may be commonly used.

Waveform selection is made by the waveform code $C_w$ corresponding to the waveform of input signal $x_h$ so as to choose a waveform which is the most approximate to that of input signal $x_h$. The waveform read out from ROM 120 is multiplied through multiplier 123 by gain $G_4$ corresponding to the amplitude of input signal $x_h$ so the amplitude of the waveform read out from ROM 120 may be the same as that of input signal $x_h$. Thus obtained is a substitution signal which fits in input signal $x_h$ smoothly and naturally.

Figure 27:
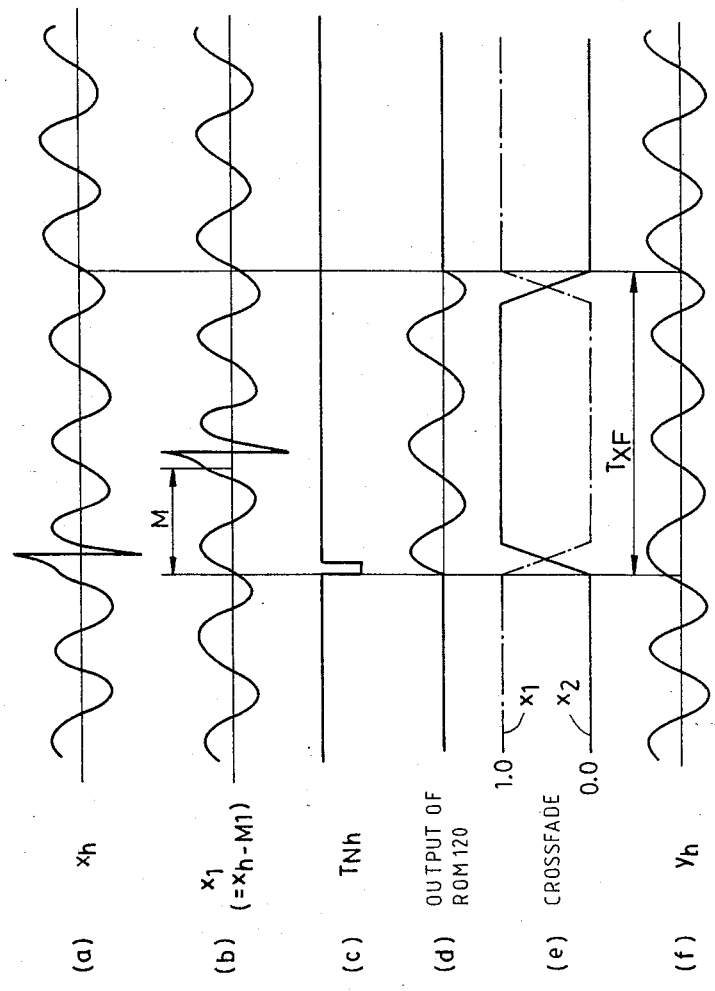
FIG. 27 comprising

FIG. 27 illustrates an example of the operation by the circuit shown in FIG. 26. As will be seen from the figure, the signal switching starts a little before the noise intervention takes place due to delay circuit 124 so that several tens of samples preceding and following the noise-interposed portion in signal $x_{h-M}$ are all replaced by the waveform (waveform with nearly the same shape and cycle as those of input signal $x_i$) read out from ROM 120. The signal switching is carried out smoothly due to cross fader 122. This method also can achieve a good effect in eliminating two or more noises close to each other with a stable operation by a simple circuit.

Waveform code $C_w$ and amplitude gain $G_4$ shown in FIG. 26 may be produced, for example, on the basis of linear prediction coefficients $a_1, a_2, \ldots, a_p$ calculated by linear prediction coefficients calculation circuit 11 and autocorrelation function $r_{0,i}$ calculated by autocorrelation function computation circuit 10, shown in FIG. 2, respectively. An example of a circuit so made is illustrated in FIG. 28 where like characters or numerals indicate corresponding parts to those shown in FIGS. 2 and 26.

Figure 28:
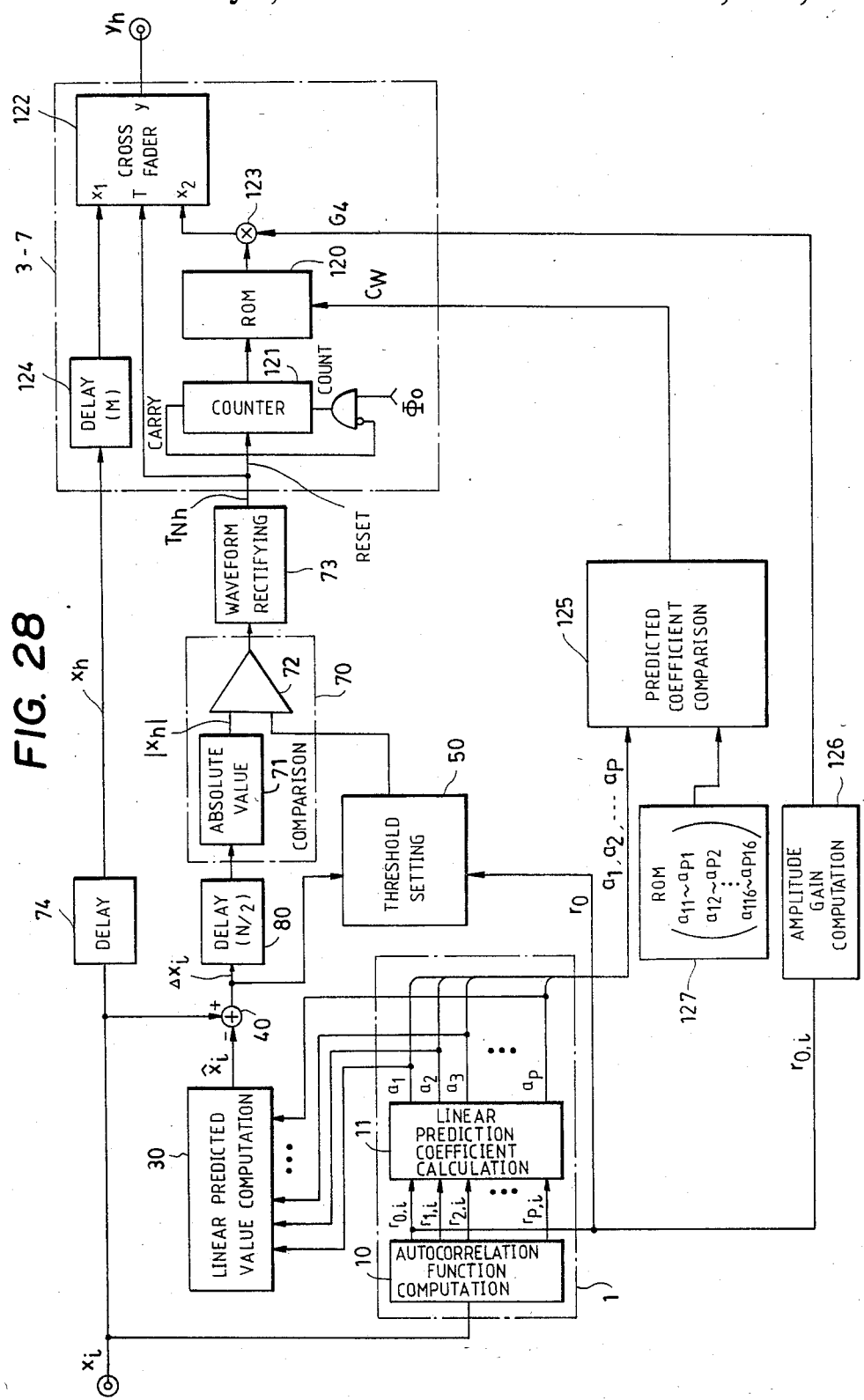
FIG. 28 is a block diagram showing an example of noise elimination device wherein data of waveform code $C_w$ and amplitude gain $G_4$ are obtained on the basis of the linear prediction coefficients as well as the 0-th order autocorrelation function.

In FIG. 28, linear prediction coefficients of each waveform stored in ROM 120 are registered in ROM 127 as a numerical table as shown in Table 2 below which applies to a case where 16 different waveforms are registered.

TABLE 2

| WAVEFORM NO. | LINEAR PREDICTION COEFFICIENTS |
|---|---|
| WAVEFORM 1 | $a_{11}, a_{21}, \ldots, a_{p1}$ |
| WAVEFORM 2 | $a_{12}, a_{22}, \ldots, a_{p2}$ |
| ⋮ | |
| WAVEFORM 16 | $a_{116}, a_{216}, \ldots, a_{p16}$ |

Linear prediction coefficient comparison circuit 125 compares prediction coefficients $a_1, a_2, \ldots, a_p$ of the actual input signal with prediction coefficients registered in the above table and selects the closest group of registered linear prediction coefficients to those of the actual input signal, thereby determining waveform code $C_w$.

Given the average signal amplitude squared by the 0-th autocorrelation function $$r_{0,i} = \sum_{k=i-N+1}^{i} x_k^2$$

amplitude gain computation circuit 126 calculates amplitude gain $G_4$:

$$G_4 = \sqrt{\frac{1}{N} r_{0,i}}$$

for the output of ROM 120.

With waveform code $C_w$ and amplitude gain $G_4$ thus obtained, multiplier 123 outputs an approximate substitution signal to input signal $x_i$.

While in the circuit shown in FIG. 28, ROM 127 and prediction coefficient comparison circuit 125 are provided separately, a microprocessor may alternatively be used to perform their processings as well as to obtain amplitude gain $G_4$.

Figure 29:
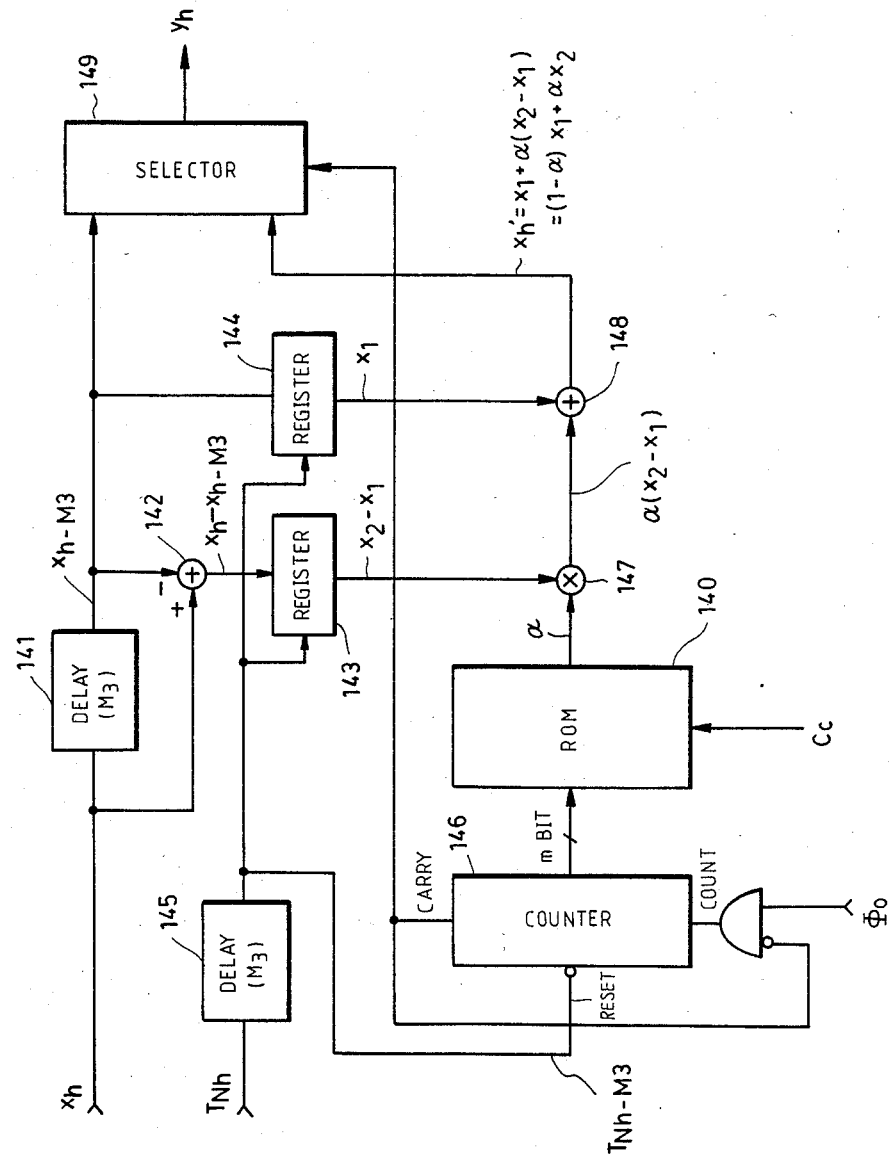
FIG. 29 is a block diagram showing an example of signal correction circuit whereby a noise-comprising section of the input signal is replaced with a substitution curve which is selected according to the characteristics of the input signal.

(e) FIG. 29 illustrates still another example of signal correction circuit 3. Signal correction circuit 3-8 picks out samples comprising noise therein and extending for M₃ stages (suppose data from ROM 140 to be described later are selected by m-bit address given by counter 146 also to be described later, a section comprising a maximum of $2^m$ samples is interpolated and, in this case, $M_3=2^m$) and interpolates that section of samples with a suitable substitution curve which is selected according to the characteristics of the neighbouring input signal $x_h$ thereby to carry out noise elimination.

In FIG. 29, delay circuit 141 delays input signal $x_h$ by M₃ stages to output $x_{h-M_3}$. Adder 142 calculates level difference $x_{h-x_{h-M_3}}$ between input $x_h$ and delayed input $x_{h-M_3}$, namely, level difference between the two samples, one M₃ stages behind the other. This level difference $x_{h-x_{h-M_3}}$ is added to register 143. Delayed output $x_{h-M_3}$ from the delay circuit 141 is added to register 144.

Noise detection trigger $T_{Nh}$ is M₃ staged delay by delay circuit 145 and then added to registers 143 and 144. In register 144 is thus latched level $x_1$ of delayed input $x_{h-M_3}$ at the beginning of noise interference. In register 143 is latched level difference $x_2-x_1$ between said level $x_1$ and level $x_2$ of delayed input $x_{h-M_3}$, level $x_2$ being M₃ stages behind level $x_1$. Level difference $x_2-x_1$ is multiplied by a coefficient α which varies from 0 at the beginning to 1 in the end for a span of M₃ stages and this product is added to $x_1$ to obtain a curve:

$$x_h' = x_1 + \alpha(x_2 - x_1) = (1-\alpha)x_1 + \alpha x_2$$

which is a substitution signal that smoothly replaces the $x_1$ to $x_2$ section of delayed input $x_{h-M_3}$.

ROM 140 memorizes various forms of substitution curves α varying from its initial value 0 to 1 in the end for a span of M₃. Selection of substitution curve α is made by curve selection code $C_c$ corresponding to the waveform of input signal $x_h$ so as to choose the most approximate curve to input $x_h$. Specifically, substitution curve selection may be made on the basis of 0-th autocorrelation function $$r_{0,i} = \sum_{k=i-N+1}^{i} x_k^2$$

as in the example shown in FIG. 28.

Counter 146 is reset by the input of trigger $T_{Nj-M_3}$ and starts counting up by fixed clock $\Phi_0$. Using the count thus given as address, ROM 140 successively outputs the curve data selected by curve selection code $C_c$. Counter 146 delivers out the carry output at its maximum count M₃ to turn the gate off and stops counting. From these operations results a substitution curve approximate to input signal $x_h$ and varying from the initial value 0 to the last value 1 for a span of M₃ stages.

Multiplier 147 multiplies said level difference $x_2-x_1$ by substitution curve α to calculate $\alpha(x_2-x_1)$. Adder 148 adds $x_1$ thereto to obtain $x_1+\alpha(x_2-x_1)$ as substitution signal $x_h'$. Selector 149 outputs this signal for M₃ stages during which substitution $x_h'$ is being generated by the carry output of counter 146. Thus obtained from selector 149 is output $y_h$ which smoothly replaces the noise-interposed portion without cross-fading operation.

FIG. 30 illustrates the operation by the circuit shown in FIG. 29. As will be seen, interval M₃ starting by $x_1$ and ending by $x_2$ in delayed input $x_h - M_3$ is replaced by substitution curve α (FIG. 30 (e)) and is outputted as $y_h$ (FIG. 30 (c)) by ROM 140.

According to the invention, noise detection is carried out by the linear prediction method so that noise detection is possible without the error detecting code (i.e., without having to restrict the data codes representing information). Besides, noises detected include not only those intermingling in the course of data transfer but also noises present in the original signal itself. Further, noises of low correlativity may also be precisely detected without erroneous judgement by a noise detection threshold value which is allowed to vary depending on the input signal. According to the invention, moreover, the noise control effect is also achieved with regard to the burst error or a relatively long noise lasting, e.g., for one msec.

What we claim is:

1. A noise elimination device comprising:
   linear predicted value computation means for receiving a digitized continuous input signal and for computing a linear predicted value of the input signal wherein said linear predicted value computation means comprises means for computing autocorrelation function of said input signal, means for computing linear prediction coefficients from said computed autocorrelation function and means for calculating the linear predicted value as a function of said linear prediction coefficients;
   prediction error detection means for computing a prediction error corresponding to the difference between the linear predicted value and said input signal;
   threshold value setting means for setting a noise detection threshold value for said input signal on the basis of at least one of instantaneous values of said input signal and the computed prediction error corresponding to said instantaneous values;
   comparison means, coupled to an output of the prediction error detection means and to an output of the threshold value setting means, for judging whether said prediction error has exceeded said threshold value or not and, if it has, regarding the instantaneous value at that time as noise;
   substitution signal producing means for producing a substitution signal on the basis of an instantaneous value in the vicinity of the instantaneous value having been regarded as noise by said comparison means; and
   switching means for outputting said input signal when noise has not been detected as a result of comparison by said comparison means and said substitution signal when noise has been detected.

2. A noise elimination device as defined in claim 1 wherein said threshold value setting means sets a threshold value in accordance with respective short interval integrated values of said input signal and said prediction error.

3. A noise elimination device as defined in claim 1 wherein said substitution signal producing means outputs, as the substitution signal, the sampled value in the vicinity of a sample at which noise has been detected.

4. A noise elimination device as defined in claim 1 wherein said substitution signal producing means outputs, as the substitution signal, a signal corresponding to a linear coupling of instantaneous values preceding and following an instantaneous point in the input signal at which noise has been detected.

5. A noise elimination device as defined in claim 1 wherein said substitution signal producing means produces the substitution signal as a function of the output signal of said switching means.

6. A noise elimination device as defined in claim 5 wherein said substitution signal producing means produces the substitution signal by calculating the linear predicted value from the output signal of said switching means.

7. A noise elimination device as defined in claim 1 wherein said substitution signal producing means includes a waveform memory containing prestored waveform data, wherein said substitution signal producing means produces the substitution signal by utilizing a signal produced from the waveform memory and resembling said input signal.

8. A noise elimination device as defined in claim 7 wherein certain stored waveform data is read out in response to the output of said means for computing autocorrelation function of said input signal.

9. A noise elimination device as defined in claim 1 wherein said substitution signal producing means outputs the linear predicted value of the substituted portion of the input signal as the substitution signal.

10. A noise elimination device as defined in claim 1 wherein said switching means switches between an original signal and the substitution signal by gradually attenuating one of the original signal and the substitution signal and gradually increasing the other.

11. A noise elimination device comprising:
linear predicted value computation means for computing a linear predicted value of a continuous input signal wherein said linear predicted value computation means comprises means for computing autocorrelation function of said input signal, means for computing linear prediction coefficients from said computed autocorrelation function and means for calculating the linear predicted value as a function of said linear prediction coefficients;
prediction error detection means for determining a prediction error corresponding to the difference between the linear predicted value and the input signal;
comparison means for comparing the prediction error with a preset threshold value, wherein when the prediction error exceeds the threshold value the input signal at the point where the threshold value is exceeded is regarded as noise; and
signal correction means for producing a substitution signal as a function of the characteristics of the input signal near the point where the threshold was exceeded, deleting the portion of the input signal for which the threshold was exceeded and replacing it with the substitution signal to provide a final output signal.

12. A noise elimination device comprising:
linear predicted value computation means for computing a linear predicted value of a digitized continuous input signal;
predicted error detection means for computing a prediction error corresponding to the difference between the linear predicted value and said input signal;
threshold value setting means for setting a noise detection threshold value for said input signal on the basis of at least one of sampled value of said input signal and the computed prediction error corresponding to said sampled values;
comparison means for judging whether said prediction error has exceeded said threshold value or not and, if it has, regarding the sampled value at that time as noise;
substitution signal producing means for producing a substitution signal on the basis of a sampled value in the vicinity of the sample value having been regarded as noise by said comparison means; and
switching means for outputting said input signal when noise has not been detected as a result of comparison by said comparison means and said substitution signal when noise has been detected.

13. A noise elimination device comprising:
linear predicted value computation means for computing a linear predicted value of a digitized continuous input signal;
prediction error detection means for determining a prediction error corresponding to the difference between the linear predicted value and the input signal;
comparison means for comparing the prediction error with a preset threshold value, wherein when the prediction error exceeds the threshold value the input signal occurring at the point when the threshold value is exceeded is regarded as noise; and
signal correction means for producing a substitution signal as a function of the characteristics of the input signal occuring near the point when the threshold was exceeded, deleting the portion of the input signal for which the threshold was exceeded and replacing it with the substitution signal to provide a final output signal.

* * * * *